(12) United States Patent
Shibuya et al.

(10) Patent No.: US 6,331,811 B2
(45) Date of Patent: *Dec. 18, 2001

(54) THIN-FILM RESISTOR, WIRING SUBSTRATE, AND METHOD FOR MANUFACTURING THE SAME

(75) Inventors: Akinobu Shibuya; Koji Matsui, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/326,878

(22) Filed: Jun. 7, 1999

(30) Foreign Application Priority Data

Jun. 12, 1998 (JP) .................................................. 10-165112
Jun. 17, 1998 (JP) .................................................. 10-170313

(51) Int. Cl.⁷ ....................................................... H01K 1/012

(52) U.S. Cl. ........................... 338/308; 338/307; 338/314

(58) Field of Search ..................................... 338/306, 307, 338/308, 304

(56) References Cited

U.S. PATENT DOCUMENTS

| | | | |
|---|---|---|---|
| 4,737,757 | * | 4/1988 | Senda et al. .......................... 338/308 |
| 4,990,997 | * | 2/1991 | Nishida .................................. 357/71 |
| 5,485,333 | * | 1/1996 | Yang et al. ........................... 360/113 |
| 5,496,762 | * | 3/1996 | Sandhu et al. .......................... 437/60 |
| 5,723,382 | * | 3/1998 | Sandhu et al. ........................ 438/653 |
| 5,851,680 | * | 12/1998 | Heau ..................................... 428/472 |
| 6,017,789 | * | 1/2000 | Sandhu et al. ........................ 438/240 |
| 6,028,359 | * | 2/2000 | Merchant et al. .................... 257/750 |

FOREIGN PATENT DOCUMENTS

| | | | |
|---|---|---|---|
| 2-114639 | 4/1990 | (JP) | ............................... H01L/21/88 |
| 2-123756 | 5/1990 | (JP) | ............................... H01L/23/12 |

OTHER PUBLICATIONS

Entlish title page to 61–148732, Jul. 7, 1986.*
Japanese Patent Publication of (unexamined) No.A–04–174590, No dates.*
Japanese Patent Publication of (unexamined) No.A–63–156341, No dates.*
Japanese Patent Publication of (unexamined) No.A–03–276755, No dates.*
Japanese Patent Publication of (unexamined) No.A–61–148732, No dates.*
Japanese Patent Publication of (unexamined) No.A–3–6362, No dates.*
Japanese Patent Publication of (unexamined) No.A–09–209120, No dates.*
Japanese Patent Publication of (unexamined) No.A–09–209121, No dates.*

(List continued on next page.)

*Primary Examiner*—Karl D. Easthom
(74) *Attorney, Agent, or Firm*—Michael Best & Friedrich LLC; J. Warren Whitesel

(57) ABSTRACT

A thin-film resistor that enables a pattern to be simply formed by means of wet etching, that has an excellent resistance temperature characteristic, and that can be easily manufactured, and a method for manufacturing this thin-film resistor, as well as a wiring substrate with this thin-film resistor formed therein. A thin resistor film according to this invention has a structure in which crystal grains deposit in the matrix of amorphous titanium nitride. The thin resistor film is formed on a substrate. The crystal grains includes at least one of crystal titanium nitride and crystal titanium. The thin resistor film can be manufactured using a simple process and can provide a wide range of resistance values with a small tolerance and a temperature coefficient of resistance close to zero.

18 Claims, 21 Drawing Sheets

OTHER PUBLICATIONS

Japanese Patent Publication of (unexamined) No.A–3–132006, No dates.*

Japanese Patent Publication of (unexamined) No.A–04–206818, No dates.*

Japanese Patent Publication of (unexamined) No.A–6–085100, No dates.*

Japanese Patent Publication of (unexamined) No.A–7–34510, No dates.*

Japanese Patent Publication of (unexamined) No.A–55–158697, No dates.*

Japanese Patent Publication of (unexamined) No.A–7–024241, No dates.*

Japanese Patent Publication of (unexamined) No.A–07–086753, No dates.*

Japanese Patent Publication of (unexamined) No.A–08–070184, No dates.*

Japanese Office Action dated Sep. 5, 2000 with Examiner's comments in Boxed line. Translation of Boxed line portion only.

Japanese Office Action dated Jan. 26, 2000 with cited reference (1) JP, Publication No. 61–148732 (A) and (2) JP, Publication No. 6–306605 (A).

* cited by examiner

FIG. 4

| No. | Substrate | Current (A) | Film formation speed (mm/min) | N2 pressure (mTorr) | Substrate temperature (°C) | Film thickness (nm) | Specific Resistivity (mΩ·cm) |
|---|---|---|---|---|---|---|---|
| 1 | Si | 4 | 100 | 3 | 25 | 62.5 | 0.337 |
| 2 | Si | 4 | 200 | 3 | 25 | 34.5 | 0.434 |
| 3 | Si | 4 | 300 | 3 | 25 | 20 | 0.418 |
| 4 | Si | 4 | 400 | 3 | 25 | 15.5 | 0.391 |
| 5 | Si | 8 | 100 | 3 | 25 | 138.5 | 0.209 |
| 6 | Si | 8 | 200 | 3 | 25 | 76 | 0.286 |
| 7 | Si | 8 | 300 | 3 | 25 | 50.5 | 0.302 |
| 8 | Si | 8 | 400 | 3 | 25 | 34 | 0.323 |
| 9 | Si | 8 | 500 | 3 | 25 | 32.5 | 0.404 |
| 10 | Si | 4 | 100 | 10 | 25 | 66 | 13.315 |
| 11 | Si | 2.5 | 100 | 0.5 | 25 | 64 | 0.228 |
| 12 | Si | 4 | 100 | 3 | 100 | 61.5 | 0.282 |
| 13 | Si | 4 | 100 | 3 | 150 | 58 | 0.241 |
| 14 | Si | 4 | 100 | 3 | 200 | 59 | 0.333 |
| 15 | FR-4 | 4 | 100 | 3 | 25 | - | 0.472 |
| 16 | FR-4 | 4 | 200 | 3 | 25 | - | 0.643 |
| 17 | FR-4 | 4 | 300 | 3 | 25 | - | 0.649 |
| 18 | FR-4 | 4 | 400 | 3 | 25 | - | 0.744 |
| 19 | FR-4 | 8 | 100 | 3 | 25 | - | 0.349 |
| 20 | FR-4 | 8 | 200 | 3 | 25 | - | 0.382 |
| 21 | FR-4 | 8 | 300 | 3 | 25 | - | 0.411 |
| 22 | FR-4 | 8 | 400 | 3 | 25 | - | 0.487 |
| 23 | FR-4 | 8 | 500 | 3 | 25 | - | 0.669 |
| 24 | FR-4 | 4 | 100 | 10 | 25 | - | 21.147 |
| 25 | FR-4 | 2.5 | 100 | 0.5 | 25 | - | 0.280 |
| 26 | FR-4 | 4 | 100 | 3 | 100 | - | 0.402 |
| 27 | FR-4 | 4 | 100 | 3 | 150 | - | 0.357 |
| 28 | FR-4 | 4 | 100 | 3 | 200 | - | 0.484 |

(a)

(b)

Section taken along A-A'

(a)

(b)

THIN-FILM RESISTOR, WIRING SUBSTRATE, AND METHOD FOR MANUFACTURING THE SAME

BACKGROUND OF THE INVENTION

1. Field of the Invention

The present invention belongs to the field of electronic technologies and relates to a thin-film resistor operating as a passive element and its manufacturing method, and a wiring substrate with this thin-film resistor built therein. The present invention also relates to a wiring substrate and its manufacturing method, and in particular, to a wiring substrate with a resistor built therein and its manufacturing method.

2. Description of the Prior Art

With the recent increasing demand for smaller-sized mounting substrates, there have been an increasing number of reports on substrates with a resistor built therein. In terms of the structure, resistor built-in substrates are classified into substrates with a chip resistor part built therein, substrates with a thick-film resistor (paste) built therein, and substrates with a thin-film resistor built therein. Chip-resistor-part built-in substrates are limited in size reduction, and thick-film-resistor built-in substrates do not provide an accurate resistance value. Thin-film-resistor built-in substrates are most excellent in size reduction and provide a relatively accurate resistance value.

Japanese Patent Application Laid-Open No. 4-174590 has reported on a resistor used for a thin-film-resistor built-in substrate and comprising a nichrome alloy, tantalum nitride, ITO (Indium Tin Oxide), or metal silicide. With such a thin film, however, in the patterning method, wet etching may degrade the substrate due to the use of a strong acid, while dry etching may disadvantageously increase the time required for the process. In addition, even the wet etching method has difficulties in achieving the selective etching between the resistor and electrodes or wiring depending on the type of the resistor.

Thin titanium nitride films are conventionally used as contact barriers for semiconductor elements, as reported in Japanese Patent Application Laid-Open No. 63-156341. Japanese Patent Application Laid-Open No. 3-276755 reports on a method for manufacturing a semiconductor device that uses TiN as a barrier metal and a resistor in semiconductor elements. This resistor, however, relates to a thin TiN polycrystal film. In addition, J. Vac. Sci. Technol. A5, p.1778 (1987) and Papers Presented at Semiconductor Integrated Circuit Technology Symposium, 28, p.97 (1985) report a smaller and a larger resistance values of the thin TiN polycrystal film, that is, 20 to 25 $\mu\Omega\cdot$cm and 1,300 $\mu\Omega\cdot$cm, respectively. In this manner, the thin TiN polycrystal film cannot be easily formed into a thin high-resistance film and has a large temperature coefficient of resistance.

On the other hand, Japanese Patent Application Laid-Open No. 61-148732 reports the use as a heating resistor for a temperature detecting element of an amorphous metal compound that is a metal nitride such as TiN or TaN produced by means of high-frequency magnetron sputtering. Due to the variation of the resistance value caused by the temperature, however, this resistor was not suitable as a typical circuit resistor such as a terminal resistor.

A composite consisting of amorphous and crystal titanium nitride is disclosed as a surface treating layer for stainless steel in Japanese Patent Application Laid-Open No. 3-6362, a coating layer on a hard base substrate in Japanese Patent Application Laid-Open Nos. 5-209120 and 9-209121, a thin non-magnetic film for a magnetic head in Japanese Patent Application Laid-Open No. 3-132006, or a semiconductor contact barrier in Japanese Patent Application Laid-Open No. 4-206818. The manufacturing methods disclosed in these applications inject Ti ions into stainless steel in an atmosphere containing nitrogen, inject univalent boron ions into a titanium nitride coated layer formed on a hard base substrate by means of the arc ion plating method using cathode arc discharge, heat the substrate to 300° C. or more after ion beam sputtering, or inject ions after the formation of a TiN crystal film. In this manner, the process for forming a composite consisting of amorphous and crystal titanium nitride is complicated.

In addition, due to the needs for smaller-sized mounting substrates, there is an increasing demand for substrates such as build-up circuit boards which have a fine wiring of a multilayer wiring structure. Accordingly, there have been an increasing number of reports on substrates with a resistor built therein. In terms of the structure, resistor built-in substrates are classified into substrates with a chip resistor part built therein, substrates with a thick-film resistor paste built therein, and substrates with a thin-film resistor built therein.

Of these substrates, chip-resistor-part built-in substrates are limited in size reduction, and thick-film-resistor paste built-in substrates do not provide an accurate resistance value.

On the other hand, thin-film-resistor built-in substrates are most excellent in size reduction and provide a relatively accurate resistance value. Japanese Patent Application Laid-Open No. 4-174590, Japanese Patent Application Laid-Open No. 6-85100, and Japanese Patent Application Laid-Open No. 7-34510 have each reported on a resistor used for a thin-film-resistor built-in substrate and comprising a nichrome alloy, tantalum nitride, ITO (Indium Tin Oxide), or metal silicide.

In addition, in order to prevent the resistance value from being degraded over time due to the diffusion between the resistor and an electrode or wiring, Japanese Patent Application Laid-Open No. 4-174590 and Japanese Patent Application Laid-Open No. 7-34510 have reported on structures in which a diffusion prevention film is formed in the interface between the resistor and the electrode or wiring and in which the surface of a nickel chrome (nichrome) alloy layer acting as a resistor is passivated.

Furthermore, those electrodes or wires in a build-up circuit board which are manufactured using the photolithography technology are allowed to adhere to the resistor by roughening the substrate, but the roughening of the substrate is not suitable for fine wiring.

A substrate with a fine wiring is produced by a process using sputtering, and in this case, Cr, Ti, Mo, or Zr is generally used as adhering ground coat metal for electrodes or wires. For example, Japanese Patent Application Laid-Open No. 55-158697 reports on a substrate using Ti as a wiring ground coat.

BRIEF SUMMARY OF THE INVENTION

Object of the Invention

As described above, the conventional thin-film resistor has the disadvantages of degrading a substrate on which the thin-film resistor is formed during etching and requiring an excessive amount of time for the thin-film resistor formation process. In addition, if the thin polycrystal titanium nitride film is used as the resistor, a high-resistivity film cannot be easily formed and the thin film has a large temperature coefficient of resistance. Furthermore, a complicated manufacturing process must be used in order to form a composite consisting of amorphous and crystal titanium nitride.

In addition, if a conventionally reported thin film is used as a resistor, wet etching used to pattern the resistor may degrade the substrate due to the use of a strong acid, while dry etching that does not degrade the substrate may disadvantageously increase the time required for the process.

In addition, if a passivation film is to be formed between the resistor and the electrode or wiring, a step for forming this film is required, thereby increasing the time required for the entire process.

Furthermore, no ground coat metals conventionally proposed to improve the adhesion between the wiring and an insulator are excellent in both etching capability and adhesion.

Thus, for the conventional thin-film-resistor built-in substrates, the following problems are desirably solved: the degradation of the substrate during the etching of the resistor, the increased time for the resistor formation process, the variation of the resistance value over time which is caused by the absence of the diffusion prevention film between the resistor and the electrode or wiring, and the failure of the ground coat metal for the electrodes or wiring in the conventional build-up circuit boards to be excellent in both etching capability and adhesion.

SUMMARY OF THE INVENTION

An object of this invention is to provide thin-film resistor that enables a pattern to be easily formed by wet etching, that has an excellent temperature characteristics for resistance, and that is easy to manufacture, and a method for manufacturing this thin-film resistor, as well as a wiring substrate with this thin-film resistor built therein.

A thin-film resistor according to this invention consists of a composite of at least either crystal titanium nitride or crystal titanium and amorphous titanium nitride. In addition, in a method for manufacturing a thin-film resistor according to this invention, the thin-film resistor according to this invention is manufactured using as a process gas a nitrogen gas or a gas containing a nitrogen and using a titanium target and DC magnetron sputtering. In this case, the partial pressure of nitrogen can be controlled during sputtering to vary the amount of nitrogen in the composite in order to control the resistance value.

In addition, the number of nitrogen atoms in the composite is preferably one-third to two-thirds relative to the total number of atoms. This is because below one-third, the amount of Ti crystal deposited increases and the temperature coefficient of resistance increases whereas above two-thirds, the amorphous phase becomes unstable to vary the resistance value over time. In addition, the specific resistivity of the thin-film resistor desirably covers wide range of values. For example, to obtain a resistance value of 50Ω, a material of specific resistivity 0.1 mΩ·cm may be used to execute patterning so that the thickness is 20 nm and so that the width and the length are the same. Conversely, a material of specific resistivity 100 mΩ·cm can be used with the same pattern sizes as in the above resistor to obtain a 50-kΩ resistor. Varying the sizes enables the resistance value to be adjusted. In general, however, if the thin film is too thin, a defect may occur in the film or any physical property may change due to the strong effect of the surface structure. In addition, increasing the thickness may increase the time required for the process or may increase the stress of the film to release it from the substrate. Varying the ratio between the width and length is not suitable for reducing the size of the resistor. Although different materials are conventionally used to cover the range of resistance values, the thin-film resistor of this invention can use a single target to obtain a wide range of resistance values.

The composite of at least either crystal titanium nitride or crystal titanium and amorphous titanium nitride enables a dimensionally accurate wet etching pattern to be formed. Thus, the time required for the process and thus costs can be reduced, and the accuracy of the resistance value can be improved. In addition, the use of this composite enables the ratio between titanium and nitrogen in the thin resistor film to vary to improve the resistance temperature characteristic while increasing the range of resistance values.

This invention is achieved in view of the above needs, and its object is to provide a wiring substrate having a wiring that adheres well to an insulator.

Another object of this invention is to provide a thin-film-resistor built-in wiring substrate that provides an accurate resistance value and a high productivity, that does not adversely affect the other constituent members during production, and in which the wiring adheres well to an insulator.

Yet another object of this invention is to provide a method for manufacturing a wiring substrate having a wiring that adheres well to an insulator.

Still another object of this invention is to provide a method for manufacturing a thin-film-resistor built-in wiring substrate that provides an accurate resistance value and a high productivity, that does not adversely affect the other constituent members during production, and in which the wiring adheres well to an insulator.

To attain these objects, this invention provides a wiring substrate having a wiring on an insulator, wherein the wiring is placed on the insulator via a thin titanium nitride film provided on the insulator.

According to the invention of this configuration, the thin titanium nitride film adheres well to the insulated substrate and enables film stress to be reduced under the film formation conditions, so it is preferably used as a wiring ground coat. A wet etching pattern can be dimensionally accurately formed on this film, thereby enabling a fine wiring to be formed. Besides, this film allows wet etching using a water solution containing ammonium, thereby preventing the substrate or wiring from being degraded during etching. Consequently, using the thin titanium nitride film as the ground coat for the wiring, such a wiring substrate can be obtained that has a very reliable fine wiring.

BRIEF DESCRIPTION OF THE DRAWINGS

FIG. 4 is a table showing film formation conditions and specific resistivity for an embodiment of the thin-film resistor according to this invention;

FIG. 13(a) is a plan view and FIG. 13(b) is a sectional view;

DETAILED DESCRIPTION OF THE PREFERRED EMBODIMENTS

Figure 12:
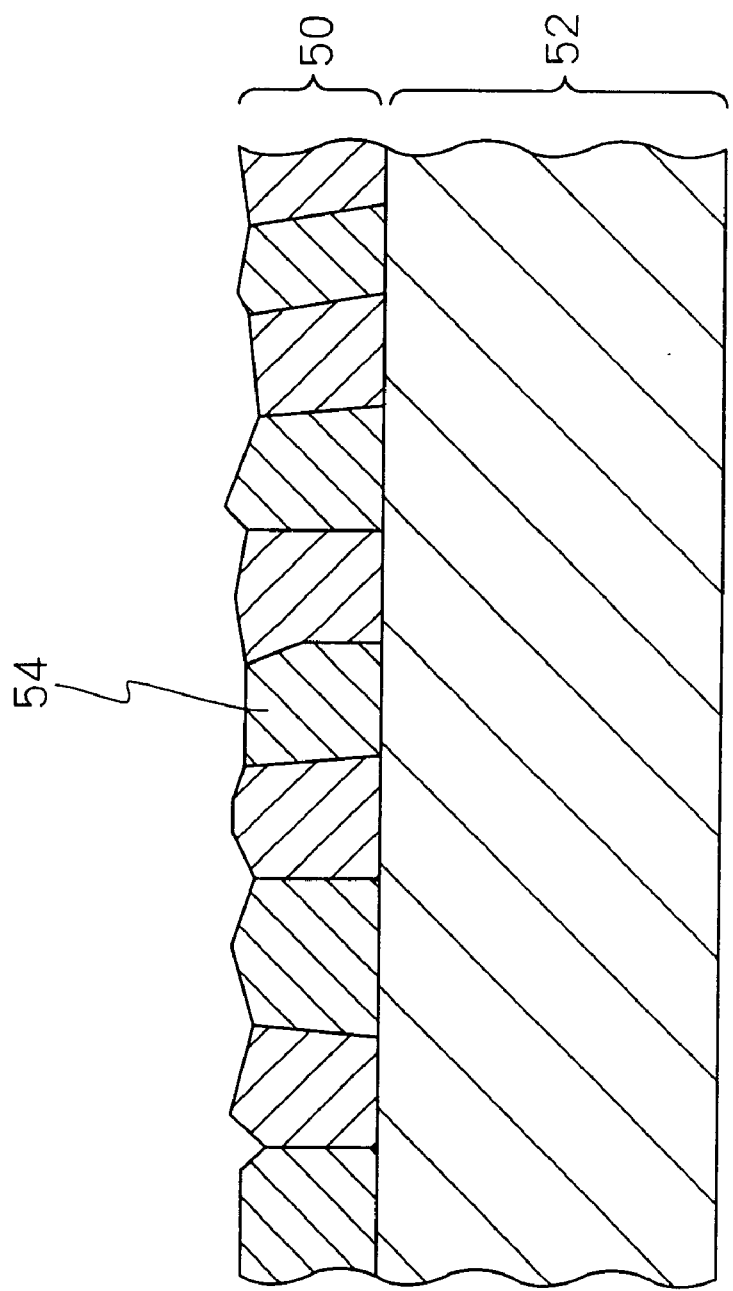
FIG. 12 is a schematic sectional view showing a conventional thin polycrystal titanium nitride film.

FIG. 12 is a schematic sectional view showing a thin titanium nitride film according to the prior art. A thin titanium nitride film 50 is formed on a substrate 52. The thin titanium nitride film 50 can be easily patterned by means of wet etching. When, however, the thin titanium nitride film 50 is used as a resistor, the temperature coefficient of resistance is large, while the range of the resulting specific resistivity is narrow. The reason is as shown in FIG. 12. That is, since the thin titanium nitride film 50 is a thin stoichiometry polycrystal film of chemical formula TiN consisting of a large number of columnar crystals 54, the resistance property is dominated by the temperature coefficient of resistance and specific resistivity value proper to TiN.

The inventor produced a thin resistor film consisting of a composite of at least either crystal titanium nitride or crystal titanium and amorphous titanium nitride to find that the temperature coefficient of resistance and the specific resistivity value significantly vary with the ratio between the amounts of crystal and amorphous solids in the thin resistor film or the ratio between titanium and nitrogen.

Figure 1:
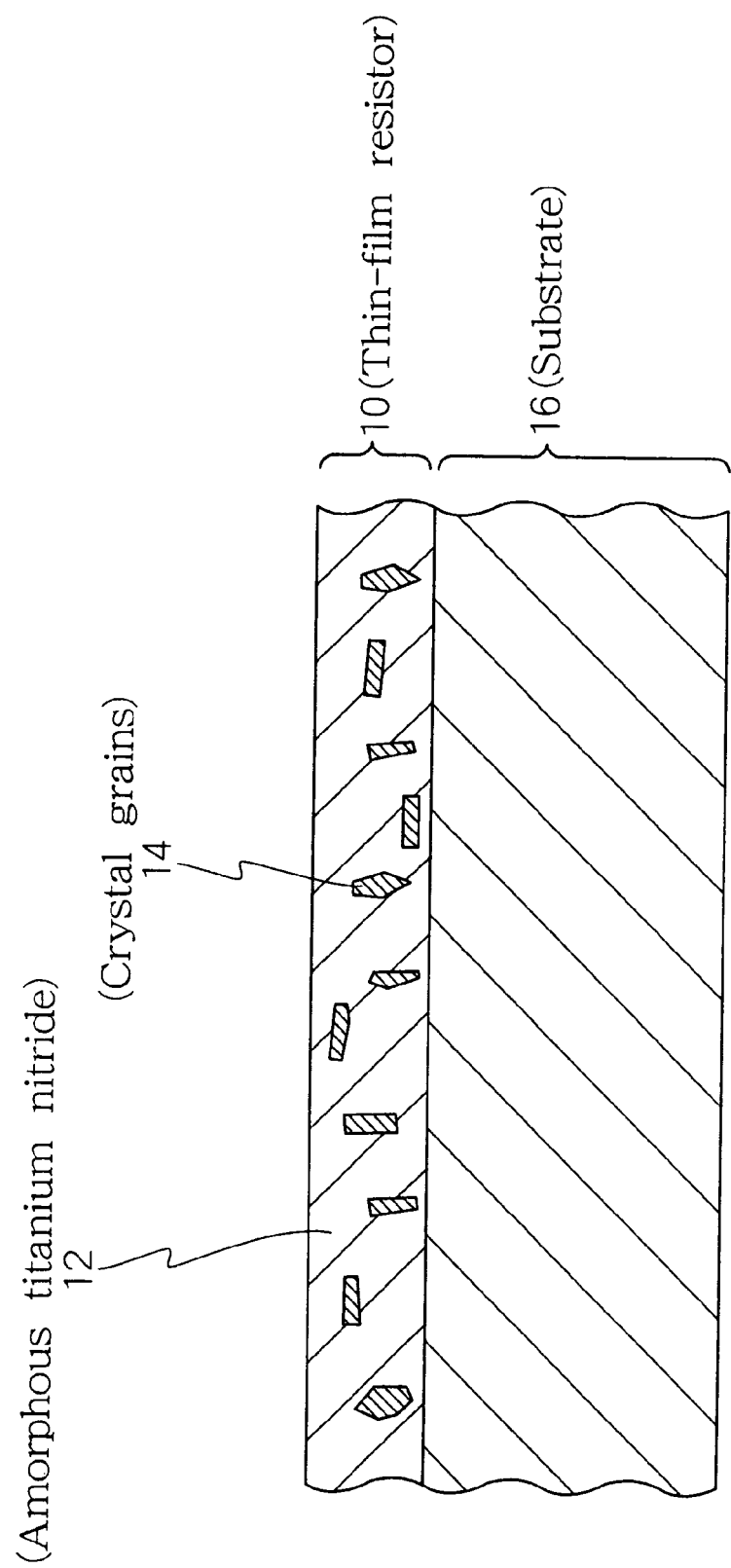
FIG. 1 is a schematic sectional view showing a thin resistor film according to this invention.

FIG. 1 is a schematic sectional view showing a thin resistor film according to a first embodiment of this invention. A thin resistor film 10 is assumed to have a structure in which crystal grains 14 deposit in the matrix of amorphous titanium nitride 12. A thin resistor film 10 is formed on a substrate 16. The crystal grains 14 comprise at least one of crystal titanium nitride and crystal titanium. Although FIG. 1 clearly shows the crystal grains 14 for easy understanding, the actual crystal grains 14 are assumed to be finer and to have no definite interfaces with the amorphous solid. The etching time for the thin resistor film 10 tends to increase with the increasing rate of nitrogen, but the thin film 10 is well suited for wet etching.

If a thin titanium nitride film consisting of only amorphous solids is subjected to heat history after manufacturing, crystals may deposit in the thin film to substantially vary the resistance value. In contrast, the thin resistor film 10 is formed by depositing the composite, thereby reducing the variation of the resistance value caused by thermal history of 500° C. or less. This may be because the amorphous and crystal solids are balanced in the composite. The crystal titanium nitride that can be contained in the composite is preferably TiN or $Ti_2N$, but this invention is not limited to such a crystal.

In addition, the thin resistor film 10 is preferably used as an alternative to a chip resistor used for amounting substrate, and enables a resistor to be formed on the surface of the substrate 16 or inside it. The substrate 16 preferably comprises an Si substrate with an insulating layer, a printed circuit board, a build-up circuit board, or a ceramic substrate, and the thin-film resistor 10 may be formed either in its inner layer wiring or on its surface. In addition, the preferable Si and ceramic substrates include a multilayer wiring substrate having an organic insulating layer on its surface. In this case, the resistor may be formed either in the inner layer wiring in the organic multilayer portion or on the surface of the substrate. In particular, if the resistor is formed in the inner layer of the substrate, the mounting area of the substrate surface can be substantially reduced without changing the substrate thickness, thereby noticeably contributing to reducing the size of the substrate. The substrate 10 may also be, for example, an organic film, a glass plate, or a metal foil.

Figure 2:
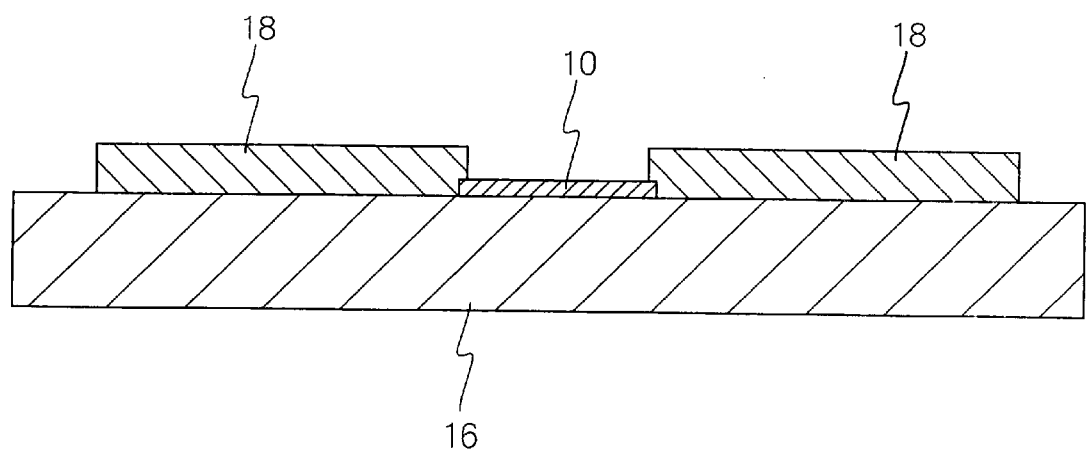
FIG. 2 is a schematic sectional view showing a first example of a method for forming the thin-film resistor according to this invention on a wiring substrate.
Figure 3:
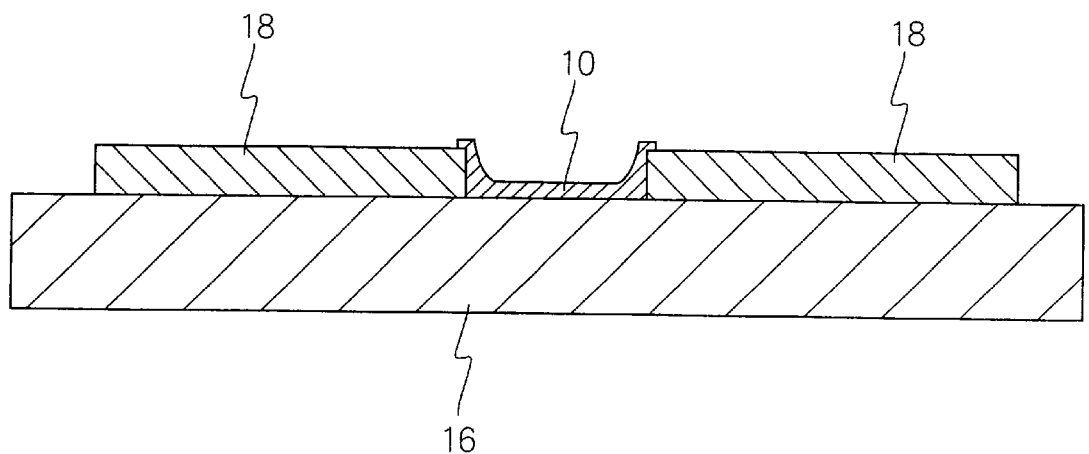
FIG. 3 is a schematic sectional view showing a second example of a method for forming the thin-film resistor according to this invention on a wiring substrate.
Figure 5:
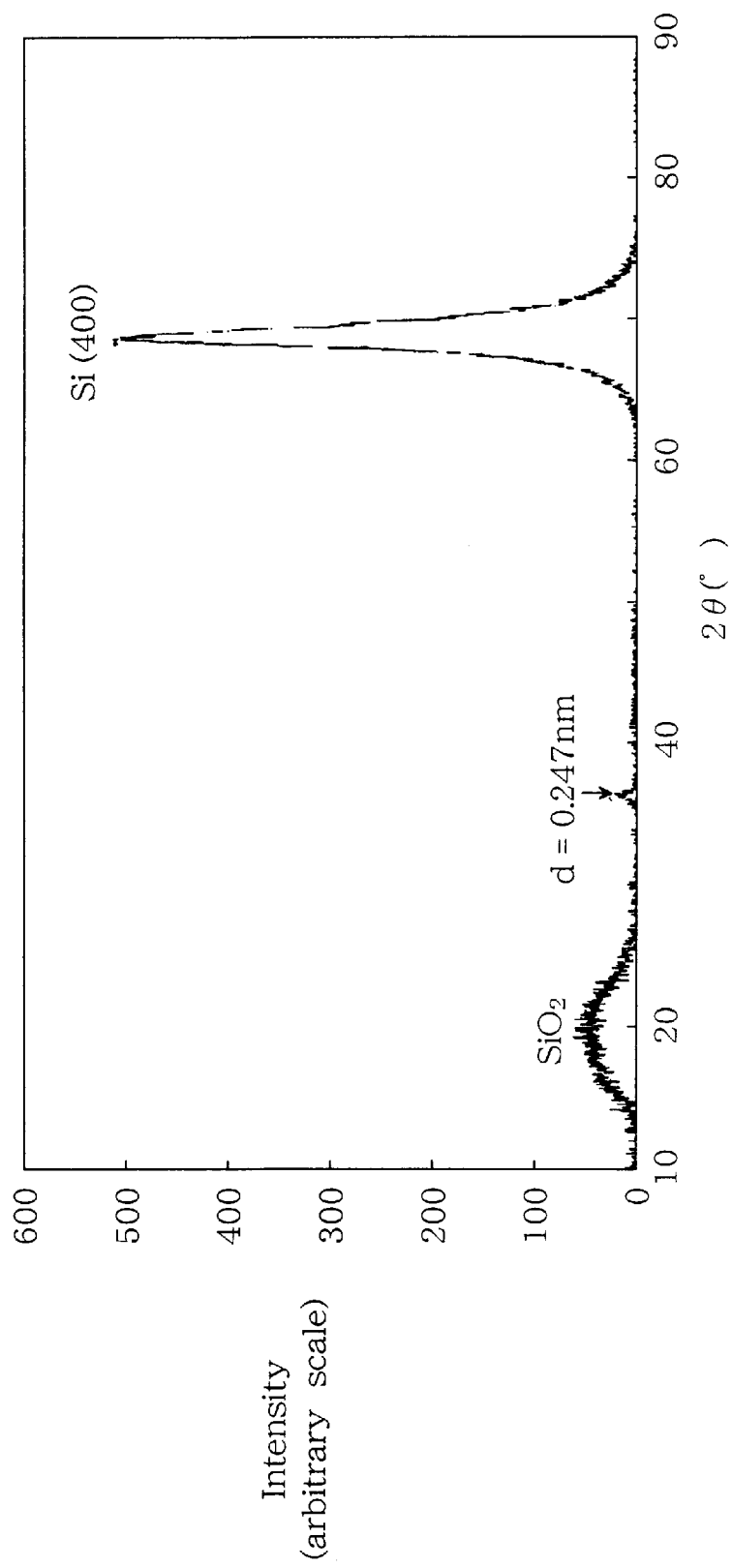
FIG. 5 is a chart of X-ray diffraction of sample 1 manufactured on an $SiO_2$/Si substrate at 25° C. and 3 mTorr, according to the embodiment of this invention.
Figure 6:
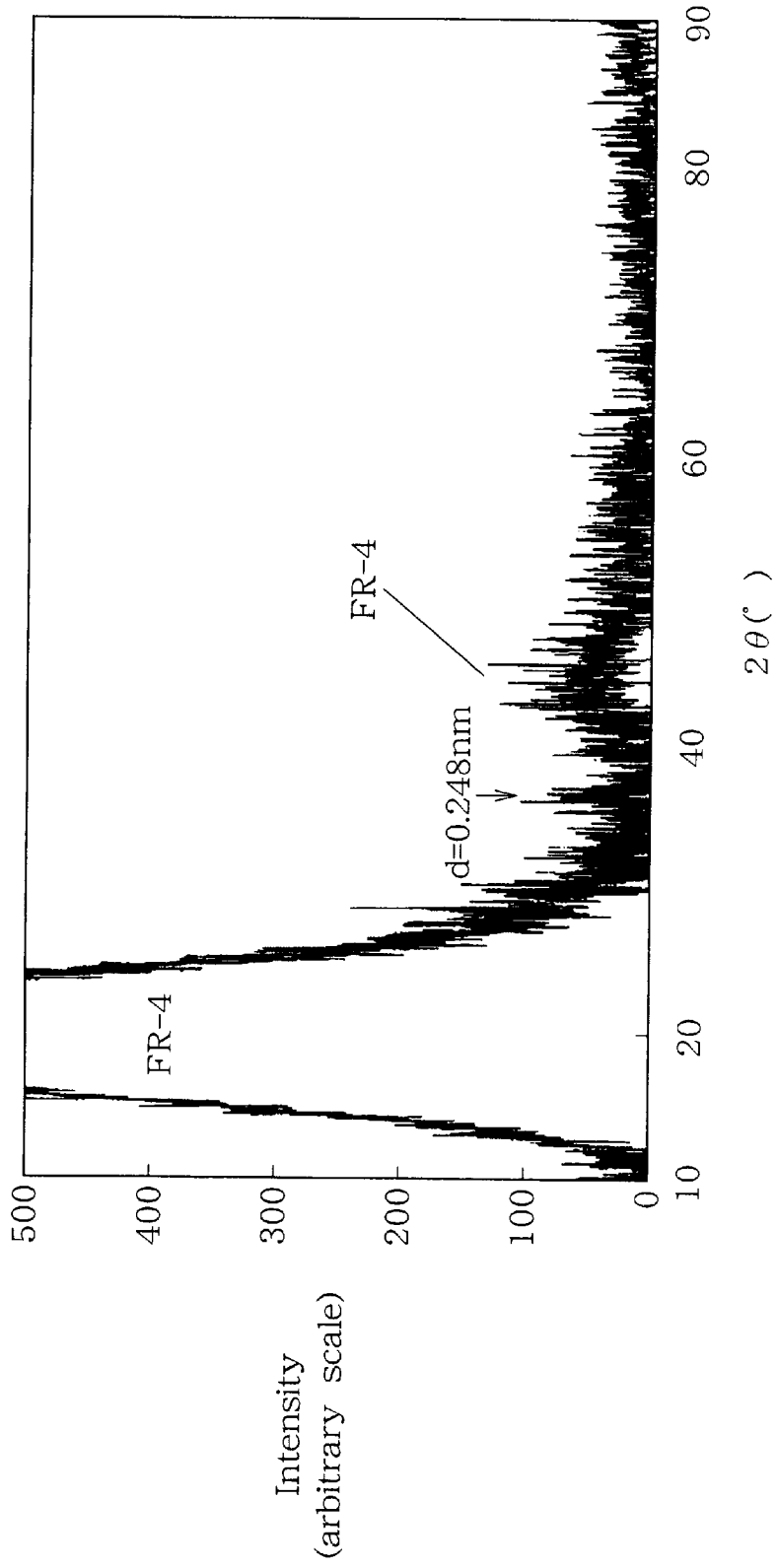
FIG. 6 is a chart of X-ray diffraction of sample 15 manufactured on an epoxy resin/FR-4 circuit board at 25° C. and 3 mTorr, according to the embodiment of this invention.
Figure 7:
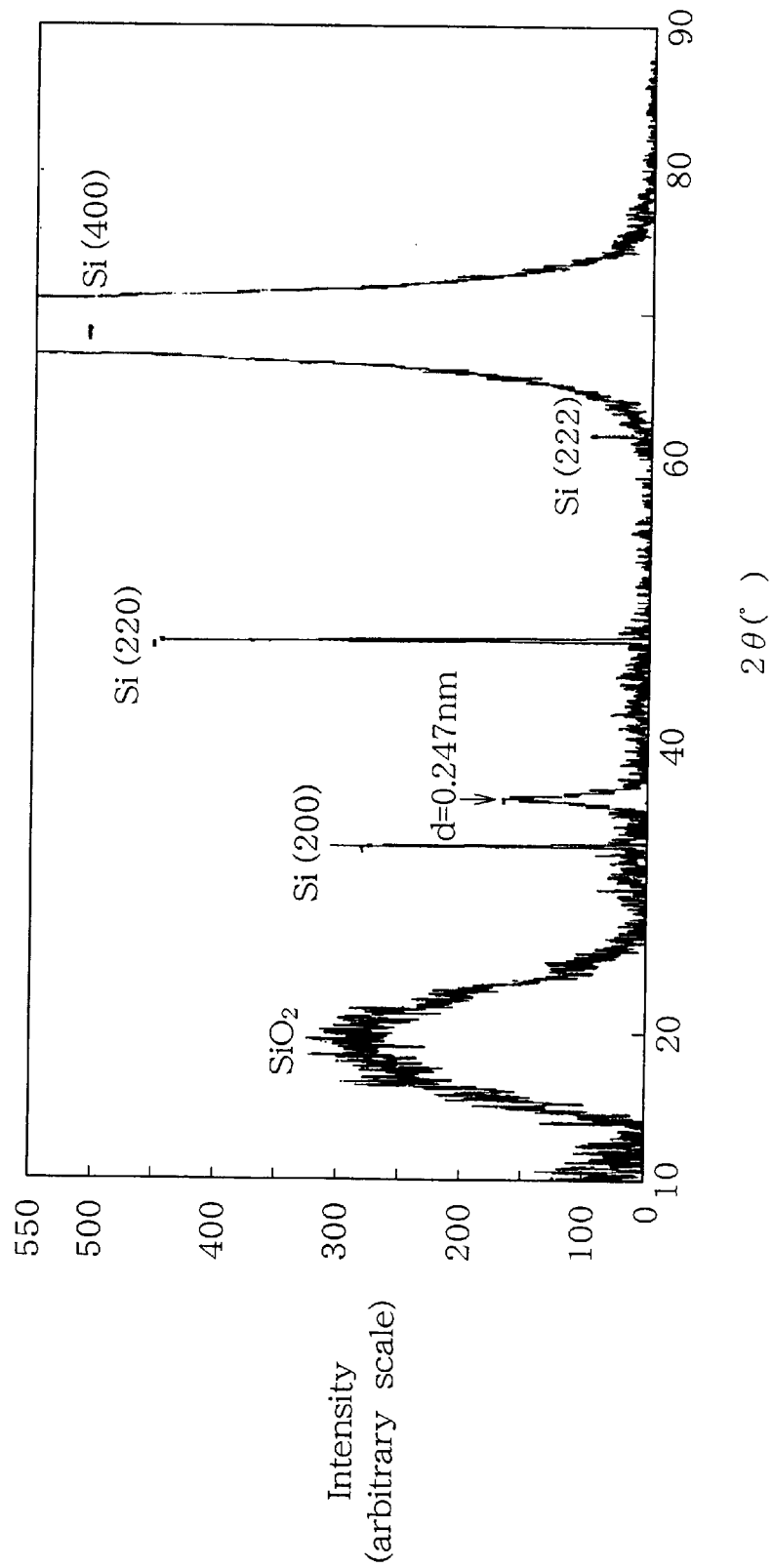
FIG. 7 is a chart of X-ray diffraction of sample 13 manufactured on an $SiO_2$/Si substrate at 150° C. and 3 mTorr, according to the embodiment of this invention.
Figure 8:
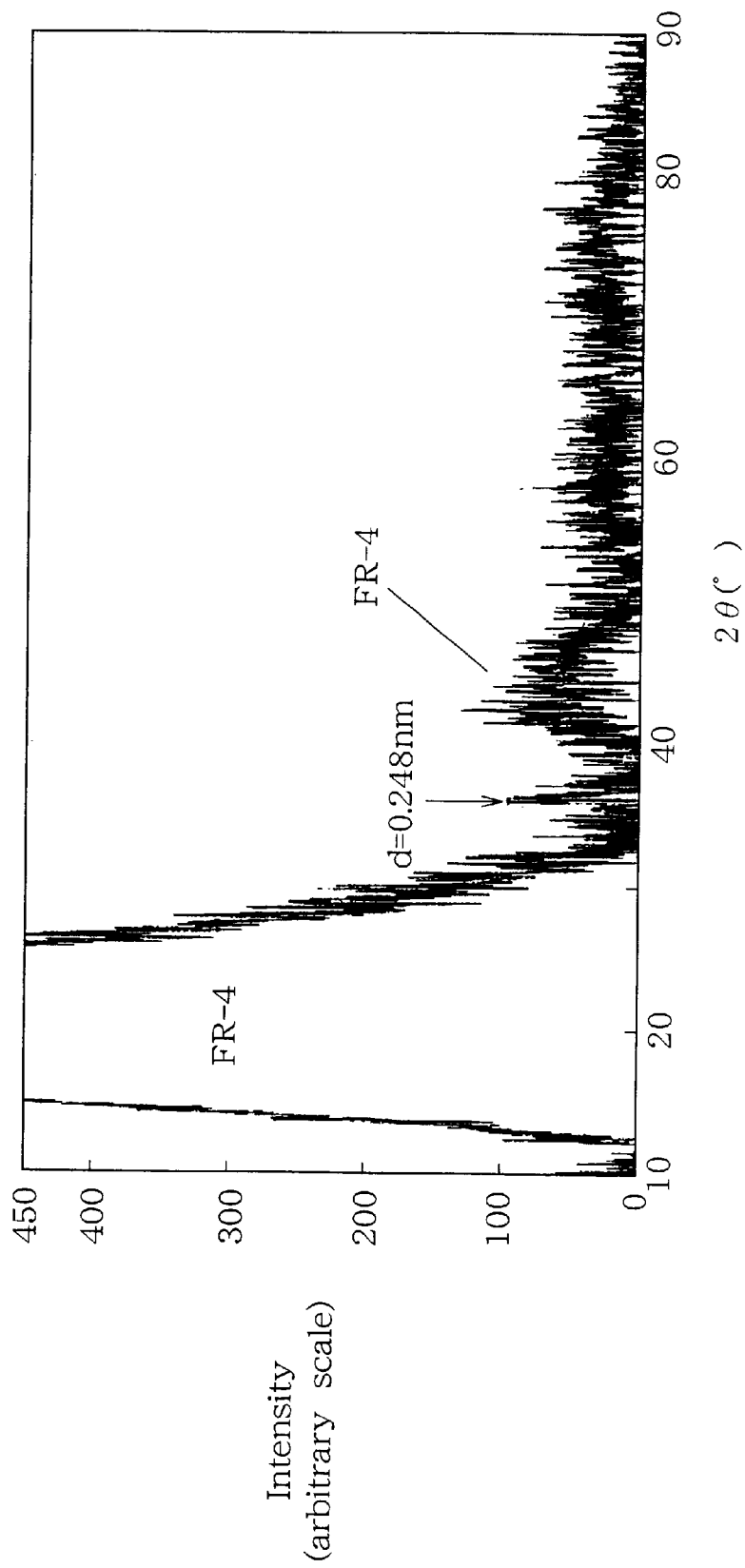
FIG. 8 is a chart of X-ray diffraction of sample 27 manufactured on an epoxy resin/FR-4 circuit board at 150° C. and 3 mTorr, according to the embodiment of this invention.
Figure 9:
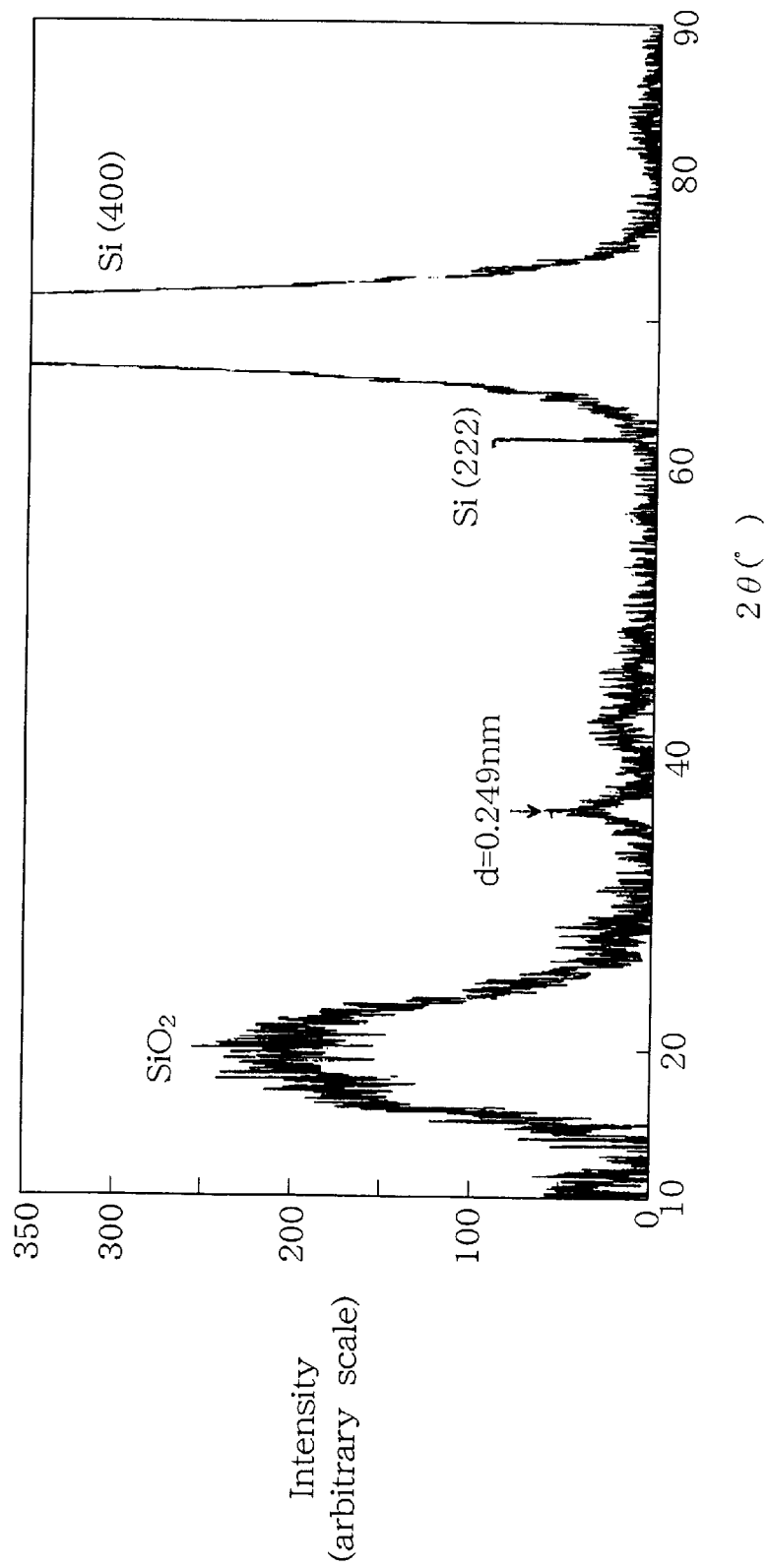
FIG. 9 is a chart of X-ray diffraction of sample 11 manufactured on an $SiO_2$/Si substrate at 25° C. and 0.5 mTorr, according to the embodiment of this invention.
Figure 10:
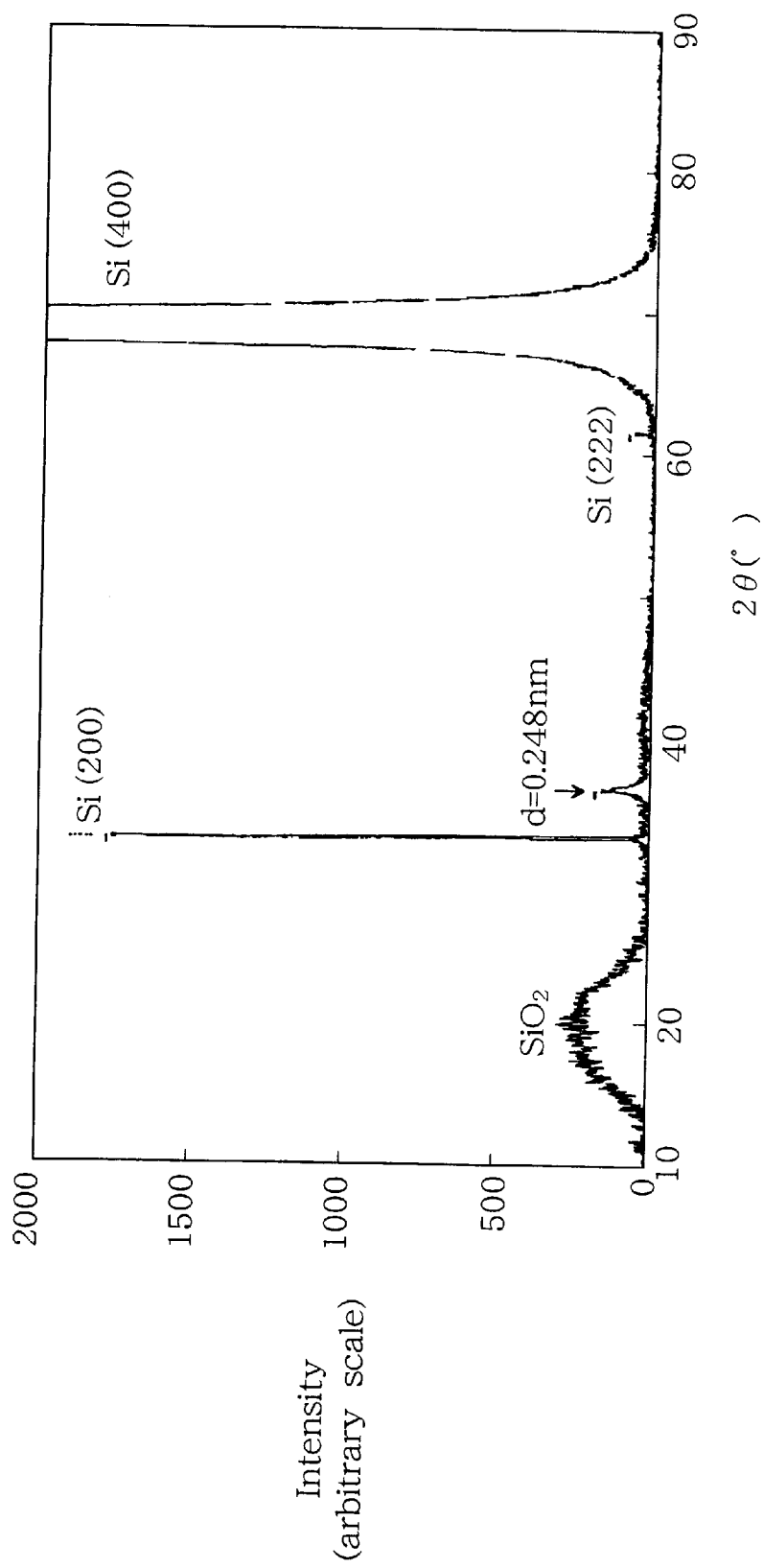
FIG. 10 is a chart of X-ray diffraction of sample 25 manufactured on an epoxy resin/FR-4 circuit board at 25° C. and 0.5 mTorr, according to the embodiment of this invention.

The following two methods can be used to form the thin-film resistor of this invention in a circuit in a wiring substrate. A first method forms the thin-film resistor 10 on the substrate 16, forms a pattern by means of photolithography, and then forms a wiring 18, as shown in FIG. 2. A second method forms the thin-film resistor 10 on the substrate 16 with the wiring 18 pre-formed therein and then forms a pattern by means of photolithography, as shown in FIG. 3. Of course, this invention is not limited to these formation methods.

A preferable method for forming the thin-film resistor 10 is preferably DC magnetron sputtering using titanium target and a nitrogen gas. In this case, the gas pressure during sputtering can be used to control the ratio between titanium and nitrogen in the thin-film resistor 10. Furthermore, the gas pressure, substrate temperature, or sputter power can be controlled during sputtering to control the type and amount of crystal in the thin film. In particular, by heating the substrate 16 up to a certain temperature during sputtering, the variation of the resistance value can be reduced when the thin film is subjected to thermal history. The substrate temperature during sputtering is preferably 500° C. or less, and in particular, a good resistance characteristic can be obtained when the film is formed at a substrate temperature of 200° C. or less.

Next, examples of this invention will be described.

Thin-film resistors each comprising of a titanium nitride composite were formed on an Si wafer with an oxide film formed on its surface and on a printed circuit board FR-4 with an epoxy resin coated on its surface. In this case, a sputter-up type inline DC sputter apparatus was used to execute reactive sputtering using a titanium target and a nitrogen gas, thereby forming thin-film resistors. The pressure in the chamber of the sputter apparatus was evacuated down to $9.9 \times 10^{-7}$ Torr or less, and was then maintained between 0.5 and 10 mTorr during film formation by introducing 50 sccm of nitrogen gas into the chamber while controlling an evacuation orifice. The surface temperature was set at 25 to 200° C., the speed at which the substrate moved over a target was set at 100 to 500 mm/min., and the sputter current was set at 2.5 to 8 A. These thin-film resistors (hereafter referred to as "samples") were evaluated by means of sheet resistivity measurements using the Van der Pauw method, thickness measurements using a contact probe film thickness meter, and thin-film structure analysis using X-ray diffraction.

FIG. 4 shows film formation conditions for the produced samples, and their film thicknesses and resistivity values. Under each set of film formation conditions, 50 samples obtained by cutting the substrate into squares of 10 mm side were measured at the room temperature, and their average was determined as the specific resistivity value. The film thickness on the printed circuit board could not be measured due to the large roughness of the surface of the substrate. Thus, the specific resistivity of the sample formed on the printed circuit board was calculated from the measured sheet resistivity value by assuming that this sample had the same film thickness as the sample on the Si substrate simultaneously produced.

The specific resistivity of the samples under the film formation conditions in FIG. 4 was between 0.209 and 13.315 mΩ·cm for the Si substrate and between 0.280 and 21.147 mΩ·cm for the FR-4 circuit board. In either substrate, a wide range of resistance values could be obtained by varying the film formation conditions. In particular, the samples produced at a nitrogen gas pressure of 10 mTorr exhibited a very large resistance value exceeding 10 mΩ·cm. The large variation of the resistance value of the samples by means of the film formation conditions is presumably caused by the different ratios between titanium and nitrogen in the thin film or the different types or amounts of crystal in the thin film. In addition, the accuracy of the resistance value of each sample corresponded to a tolerance within ±5%. In particular, the accuracy of samples 13, 14, 27, and 28 under the substrate temperature condition of 150° C. or more was high and corresponded to a tolerance within ±2%. This is assumed to be because the uniformity of the thin titanium nitride film is improved better by heating the substrate.

In addition, samples 10, 13, 24, and 27 were measured for the temperature characteristic of the resistor by measuring the resistance value at 20 and 150° C. As a result, the temperature coefficients of resistance of these samples were 87.4 ppm/° C., 186.2 ppm/° C., −24.3 ppm/° C., and 137.8 ppm/° C., indicating a good temperature characteristic, which is less than at least about 250 ppm/° C. or the range 20–150° C. As described above, the sign of the temperature coefficient of resistance was clearly shifted between plus and minus depending on the variation of the nitrogen gas pressure within the film formation conditions. Accordingly, the temperature coefficient of resistance can be allowed to approach zero by optimizing the film formation conditions.

Next, the results of evaluation of the structures of the produced samples using X-ray diffraction will be described.

Figure 11:
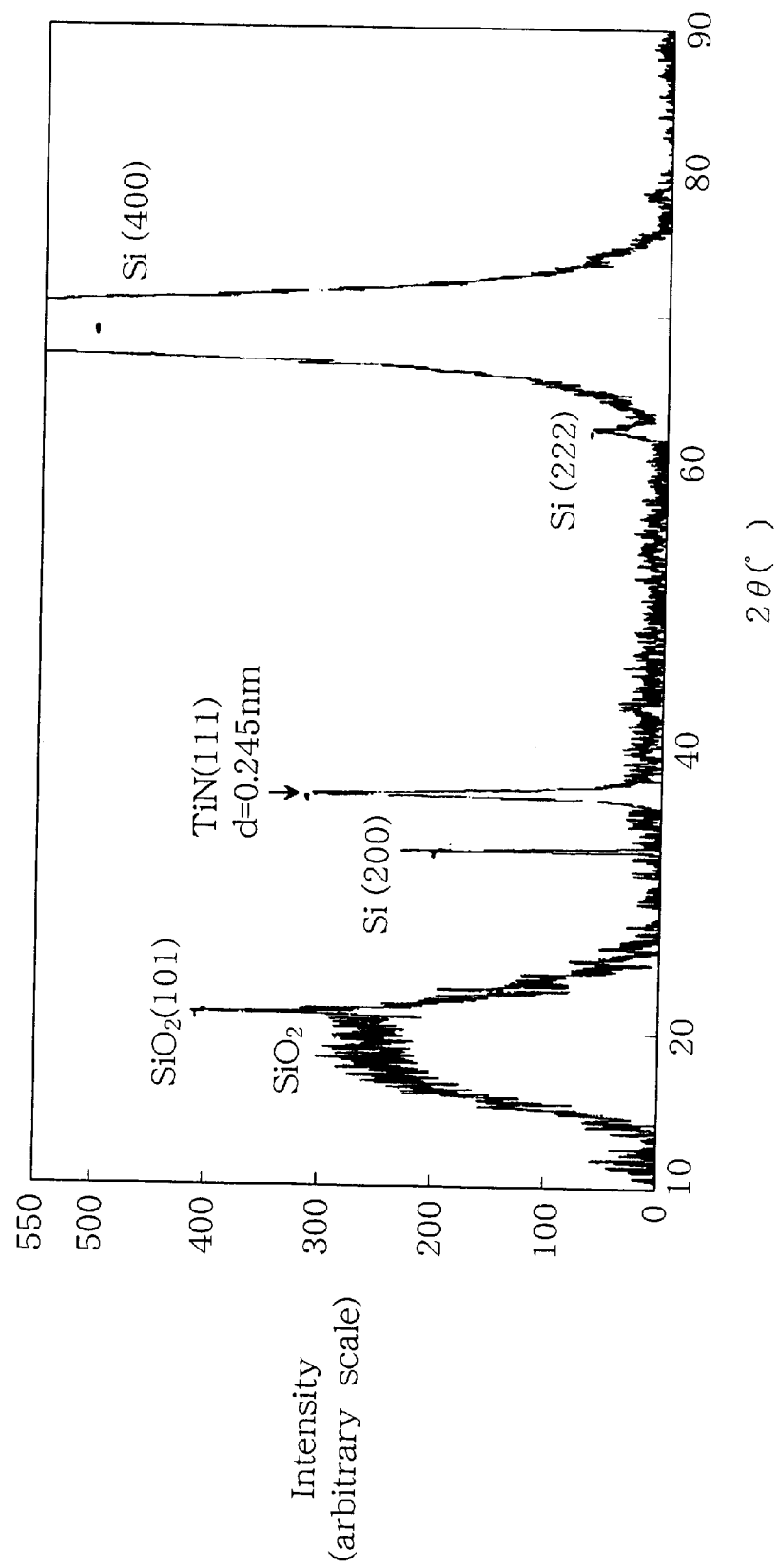
FIG. 11 is a chart of X-ray diffraction of sample 1 manufactured on an $SiO_2$/Si substrate at 25° C. and 3 mTorr and heated in a flow of nitrogen gas at 1,000° C. for five minutes, according to the embodiment of this invention.

FIGS. 5, 6, 7, 8, 9, and 10 show the results of X-ray diffraction for samples 1, 15, 13, 27, 11, and 25 in FIG. 4. FIG. 11 shows the results of X-ray diffraction for sample 1 in FIG. 4, which was heated in a flow of nitrogen gas at 1,000° C. for five minutes. The X-ray diffraction used CuKα beams.

The diffraction patterns in FIGS. 5 to 11 all show a broad and feeble diffracted beam near 2θ=36°. The figures show spacing (d) at the peak of the diffracted beam near 2θ=36°. These diffracted beams are presumably emitted from the crystal titanium nitride, and are broad and feeble because the titanium nitride has a low crystallinity and includes an amorphous solid.

On the other hand, the peak at 2θ=36.7° of the sample in FIG. 11 which was heated at 1,000° C. is sharp and strong, so it is identified as a diffracted beam from the (111) face of the TiN crystal. This indicates that the heating caused the amorphous solid of the titanium nitride to be crystallized.

According to JCPDS cards 38-1420, 17-0386, and 44-1294, the spacings of TiN(111), Ti$_2$N(200), and Ti(100) are 0.245 nm, 0.247 nm, and 0.256 nm, respectively. Thus, the broad peaks near 2θ=36° in FIGS. 5 to 10 indicate the presence of all of TiN, Ti$_2$N, and Ti crystals. The spacing (d) at the peak of the diffracted beam varies depending on the manufacturing conditions, due to the different rates of these crystals contained in the thin film, the different structures of the amorphous solid, or the different ratios between titanium and nitrogen.

Since the thin-film resistor according to this invention comprises at least either crystal titanium nitride or crystal titanium and amorphous titanium nitride, it can be manufactured using a simple process and can provide a wide range of resistance values with a small tolerance and a temperature coefficient of resistance close to zero.

In the method for manufacturing the thin-film resistor according to this invention, the thin-film resistor according to this invention can be manufactured by a simple process using as a process gas a nitrogen gas or a gas containing nitrogen and using a titanium target and DC magnetron sputtering. In addition, the partial pressure of nitrogen can be controlled to easily manufacture the thin-film resistor providing a wide range of resistance values.

A second embodiment of this invention will be described with reference to the drawings.

Figure 13:
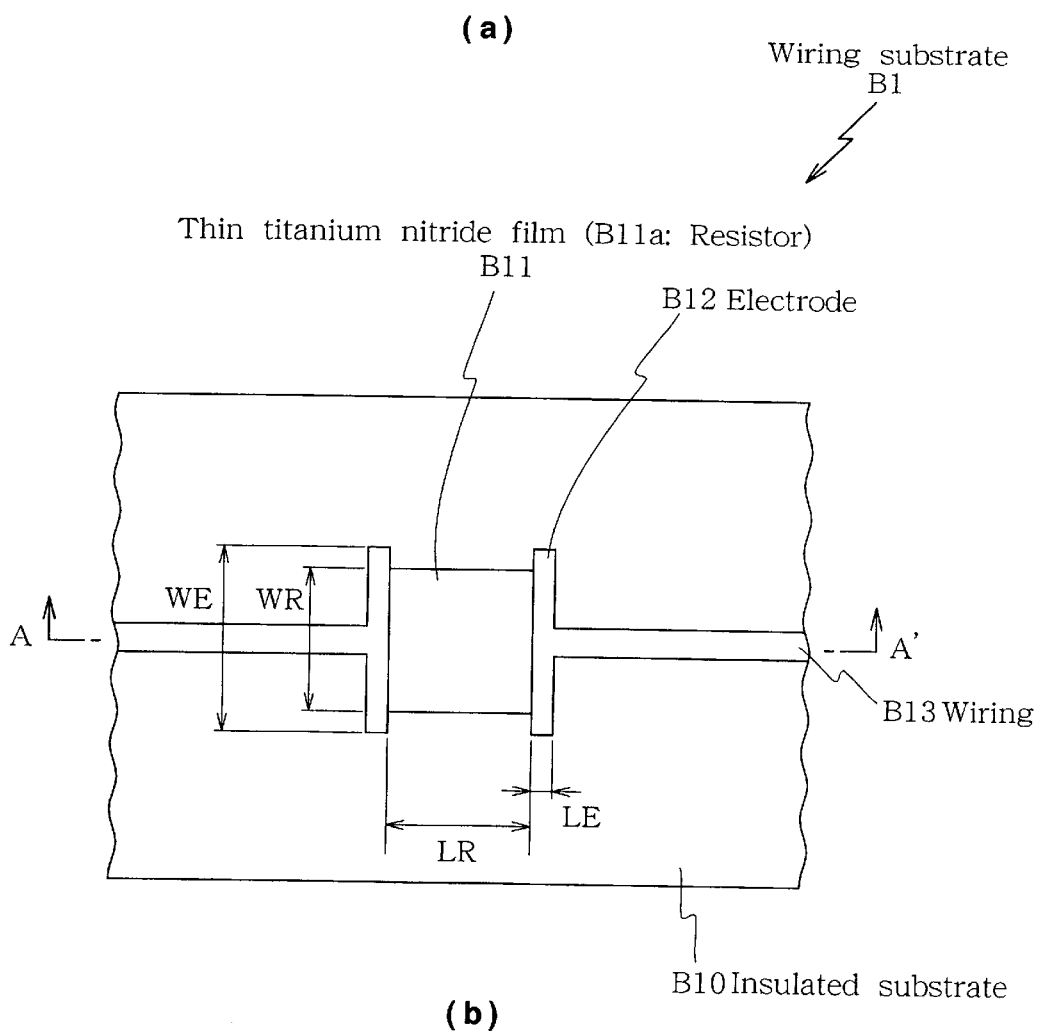
FIG. 13 shows one embodiment of a wiring substrate according to this invention.
Figure 13:
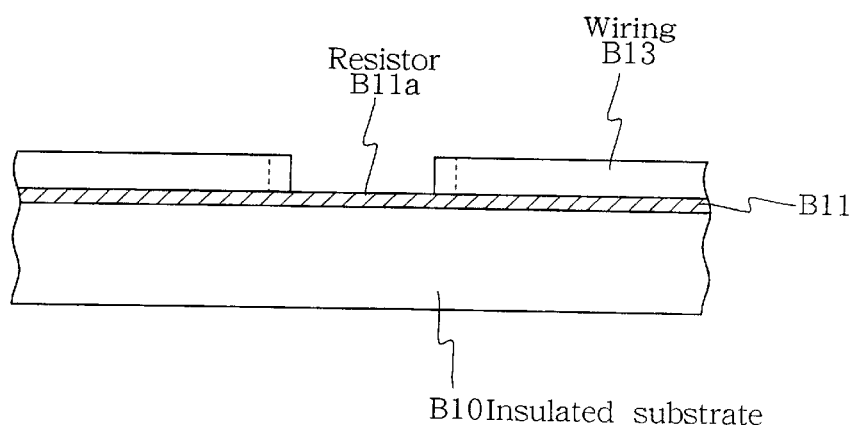

FIG. 13 shows one embodiment of a resistor built-in wiring substrate according to this invention. FIG. 13(a) is a plan view and FIG. 13(b) is a sectional view taken along A–A' in FIG. 13(a)

In a wiring substrate B1, a resistor B11a comprising of a thin titanium nitride film B11 is provided on an insulated substrate B10, and a pair of electrodes B12 are provided across the resistor B11 and have a wiring B13 connected thereto. The overall bottom surface of the electrodes B12 and wiring B13 is wired on the insulated substrate B10 using as a ground coat a thin titanium nitride film B11 configurating the resistor B11a.

Thus, the thin titanium nitride film B11 exists not only in the resistor pattern portion B11a but also under the overall bottom surface of the pattern of the electrodes B12 or wiring B13, as clearly shown in the sectional view in FIG. 13(b). Accordingly, the wiring B13 including the electrodes B12 of the wiring substrate B1 forms a laminated structure with the thin titanium nitride film B11, and the electrodes B12 and the wiring B13 are placed on the insulated substrate B10 via the thin titanium nitride film B11.

The insulated substrate B10 comprises a build-up circuit board, printed circuit board, Si substrate with an insulating layer, a ceramic substrate, an organic film, a glass plate, or a metal plate or foil with an insulating layer and may or may not have an internal wiring, vias, or through-holes.

In addition, the titanium nitride preferably comprises a thin film formed by means of PVD or CVD such as sputtering but is not limited. Its shape or composition is neither limited. The thickness of the thin titanium nitride film is selected to provide a desired resistance value based on the width and length of the resistor, which determine the resistance value.

The metal or alloy used for the electrodes or the wiring preferably comprises copper formed by means of electroplating, but its type or composition is not limited. In addition, the metal or alloy used for the electrodes or the wiring may comprise a plurality of metal or alloy layers. In particular, if copper is used for the electrodes in the topmost layer, a barrier metal or an oxidation preventing or a wettability improving metal is effectively provided on the metal used for the wiring.

As reported in Japanese Patent Application Laid-Open No. 63 -156341, the titanium nitride film is used as a contact barrier for semiconductor elements. In addition, Japanese Patent Application Laid-Open No. 3-276755 reports on a method for manufacturing a semiconductor device, including the use of TiN as a barrier metal and resistor in the semiconductor element.

Figure 22:
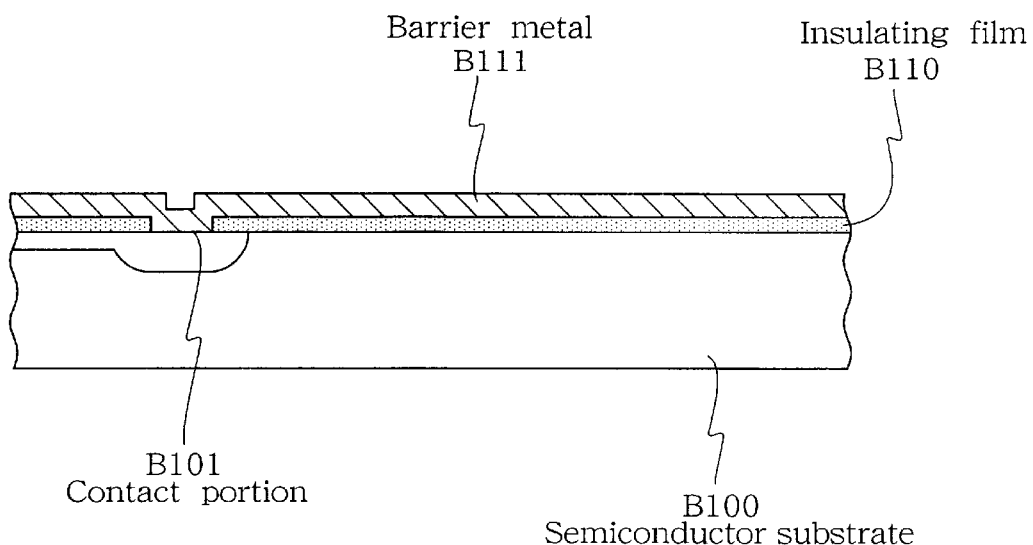
FIG. 22 is a sectional view describing a conventional semiconductor substrate using titanium nitride as a resistor.
Figure 22:
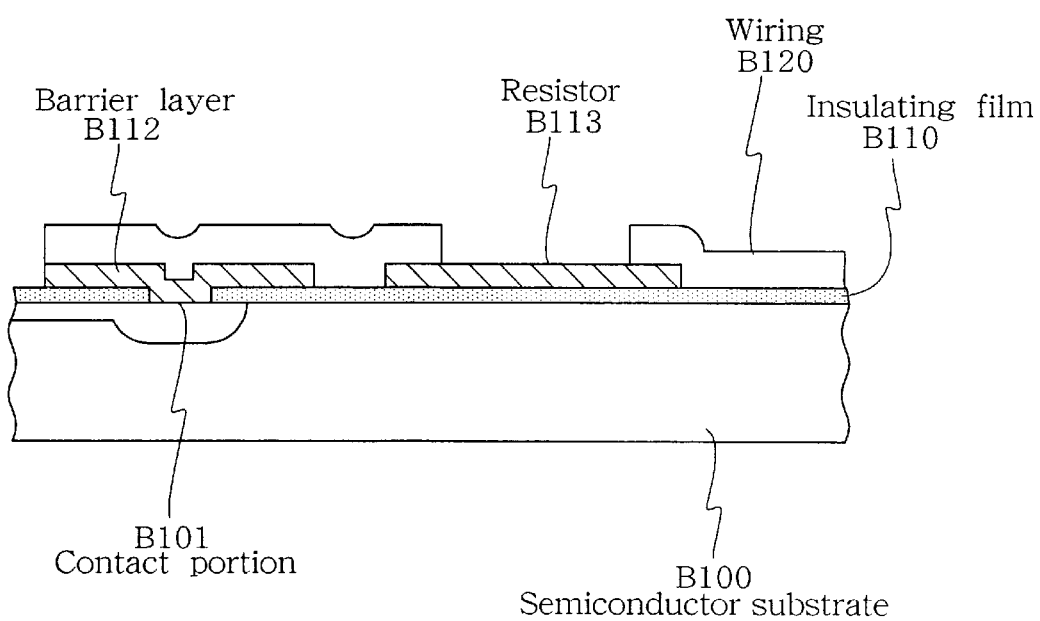
Figure 23:
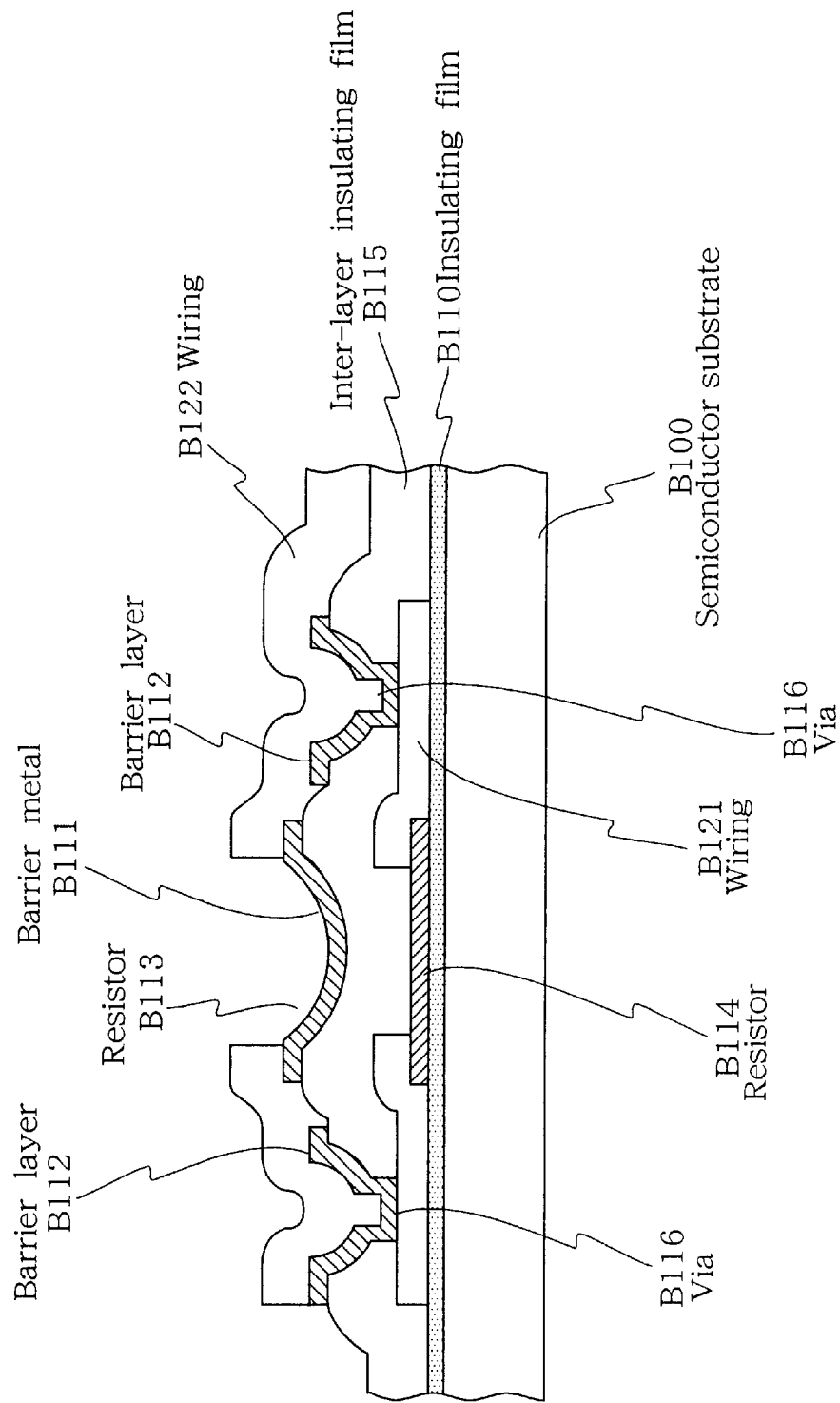
FIG. 23 is a sectional view describing a conventional semiconductor substrate using titanium nitride as a resistor.

FIGS. 22 and 23 show sectional views of a process for manufacturing a semiconductor substrate that uses titanium nitride as a resistor, which is disclosed in the conventional Japanese Patent Application Laid-Open No. 3-276755.

This method for manufacturing a semiconductor device forms an insulating film B110 on the surface of a semiconductor substrate B100, forms an opening in the insulating film B110, provides a contact portion B101 therein, and further forms a film of a barrier metal B111 to form a structure in which the barrier metal B111 contacts the semiconductor substrate B100 in the contact portion B101, as shown in (a). Next, the barrier metal B111 is patterned so as to produce a barrier layer B112 and a resistor B113, and wiring B120 is further formed, as shown in (b).

According to this method for manufacturing a semiconductor device, the steps of producing the TiN resistor and the metal wiring are independent of each other, and the metal wiring is directly formed on the insulating film and inter-layer insulating film of the semiconductor substrate. Consequently, the thin titanium nitride film does not exist under certain portions of the wiring connected to the resistor, so this structure is evidently different from the structure of this invention.

The wiring substrate B1 is characterized by using the thin titanium nitride film B11 as the resistor B11a, and in that the thin titanium nitride film B11 functions as the ground coat for the wiring B13 and electrodes B12 over the insulated substrate B10.

In addition, the method for manufacturing a semiconductor device as shown in FIG. 23 forms the insulating film B110 on the surface of the semiconductor substrate B100, forms the wiring B121 on the insulating film B110 via the resistor B114, and coats the resistor B114 and wiring B121 with the inter-layer insulating film B115. Next, via holes B116 are formed in the inter-layer insulating film B115 so as to lead to the wiring B121, further forms a film of the barrier metal B111, pattern the barrier metal B111 so as to produce the barrier layer B112 and the resistor B113, and then forms a wiring B122.

According to such a wiring substrate, the thin titanium nitride film can reduce the film stress depending on the film formation conditions and enables a uniform thin film to be formed while enabling a dimensionally accurate pattern to be formed by wet etching. Consequently, the accuracy of the resistance value can be improved.

In addition, titanium nitride is etched using a water solution containing ammonia and hydrogen peroxide and is unsusceptible to acids. Thus, titanium nitride enables selective etching between the resistor and the wiring or electrodes composed of a conductive material such as metal copper. When the thin titanium nitride film is patterned by means of etching, this component prevents the wiring or the electrodes from being degraded to avoid damaging the fine wiring. As a result, it is suitable for recent wiring substrates such as build-up circuit boards which have a fine wiring.

Besides, titanium nitride has a high barrier capability and reduces the diffusion of the metal or the insulating material used for the insulated substrate. Accordingly, the resistance value does not significantly vary over time even without a passivation film, so a stable resistance value is maintained.

The thin titanium nitride film is characterized in that by varying the film formation conditions, the composition of the film or the morphology of the crystal film can be varied to adjust the stress of the thin film correspondingly. The adjustments of the stress can provide good adhesion for any substrate. The stress can be easily adjusted particularly by using reactive sputtering that uses a titanium target and that introduces a nitrogen gas or a mixed gas of nitrogen and argon and controlling the pressure during sputtering and the temperature of the substrate.

In addition, due to its high barrier capability, titanium nitride is characterized to preclude the diffusion of the metal or alloy to the substrate used for the wiring. Thus, using the thin titanium nitride film as the ground coat for the wiring and electrodes over the insulated substrate, a very reliable wiring substrate with a fine wiring can be provided.

The wiring substrate shown in FIG. 13 is a structure with the thin titanium nitride film formed on the insulated substrate. The structure in which the thin titanium nitride film of this invention is used as the resistor and as the ground coat layer for the wiring can be applied to substrates of any structure and even to build-up circuit boards of a multilayer wiring structure.

Figure 14:
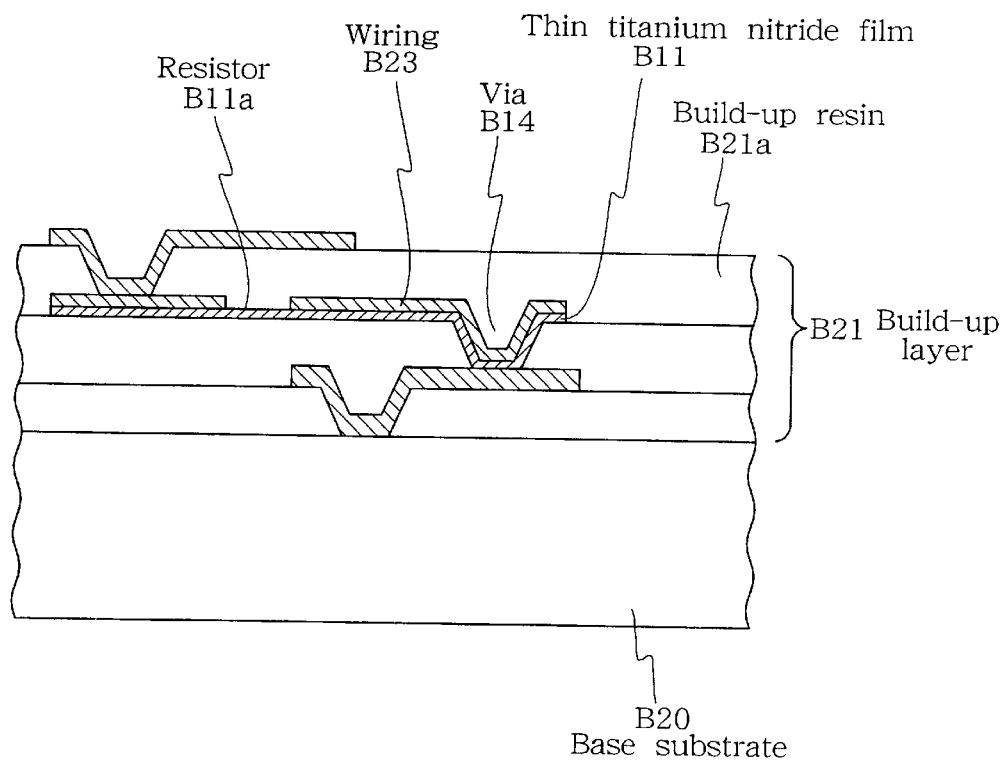
FIG. 14 is a sectional view showing one embodiment of the wiring substrate according to this invention and showing the case in which a titanium nitride resistor is provided in a build-up layer in a build-up circuit board.

FIGS. 14 to 18 show an embodiment in which this invention has been applied to a build-up circuit board, and FIG. 14 shows the case in which a resistor lies in a build-up layer. The build-up layer B21 is formed by laminating a plurality of build-up resin layers B21a on a base substrate B20, providing a wiring B23 on the surface of each of the build-up resin layers, and connecting the wirings between the build-up resin layers B21a together via the via holes B24 provided in the build-up resin layer B21a.

The wiring layer B23 with the thin titanium nitride film B11 provided as the resistor B11a forms a laminated film with the thin titanium nitride film B11. Thus, the layer B23 is connected to the wiring in the underlying build-up layer via the thin titanium nitride film B11, which functions as a barrier layer. The build-up resin layer B21a is composed of, for example, a polyimide resin obtained by spin-coating a solution containing a polyimide precursor and heating the solution at about 400° C.

Figure 15:
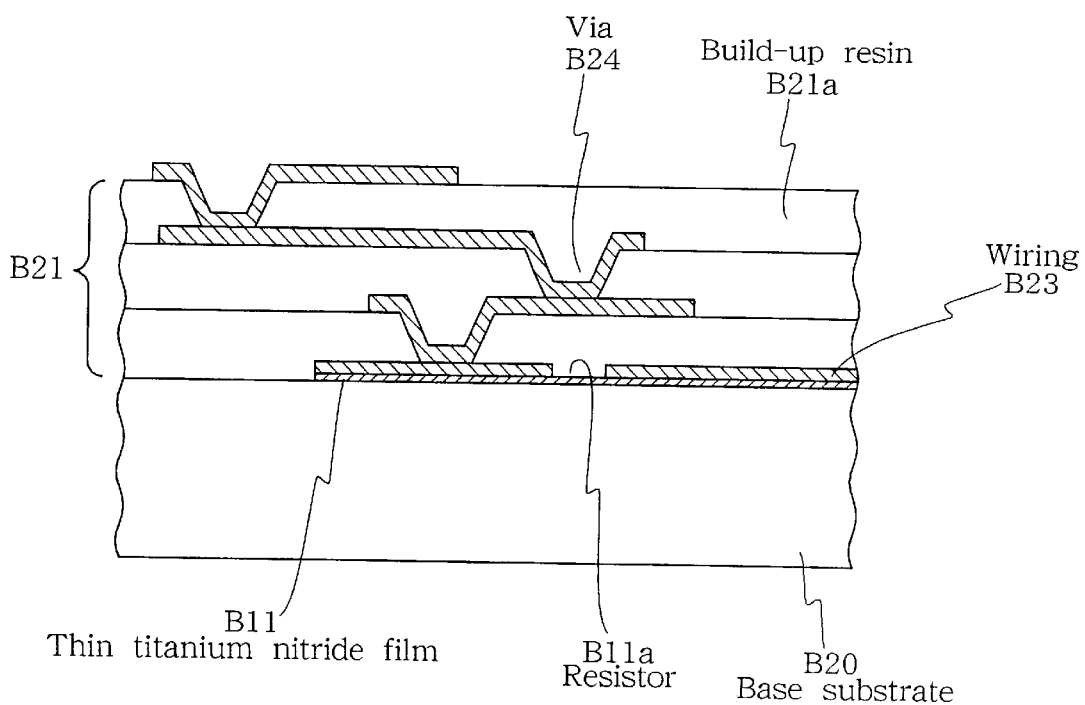
FIG. 15 is a sectional view showing one embodiment of the wiring substrate according to this invention and showing the case in which the titanium nitride resistor is provided in the interface between a base substrate and the build-up layer in the build-up circuit board.
Figure 16:
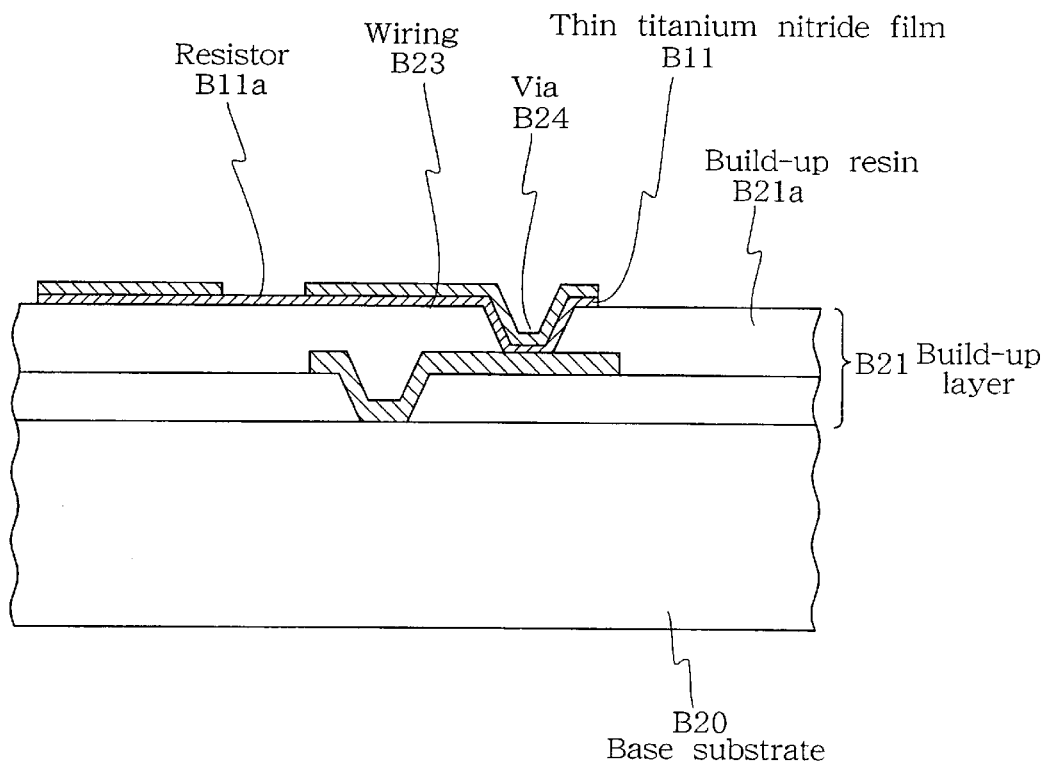
FIG. 16 is a sectional view showing one embodiment of the wiring substrate according to this invention and showing the case in which the titanium nitride resistor is provided on the surface of the build-up layer in the build-up circuit board.
Figure 17:
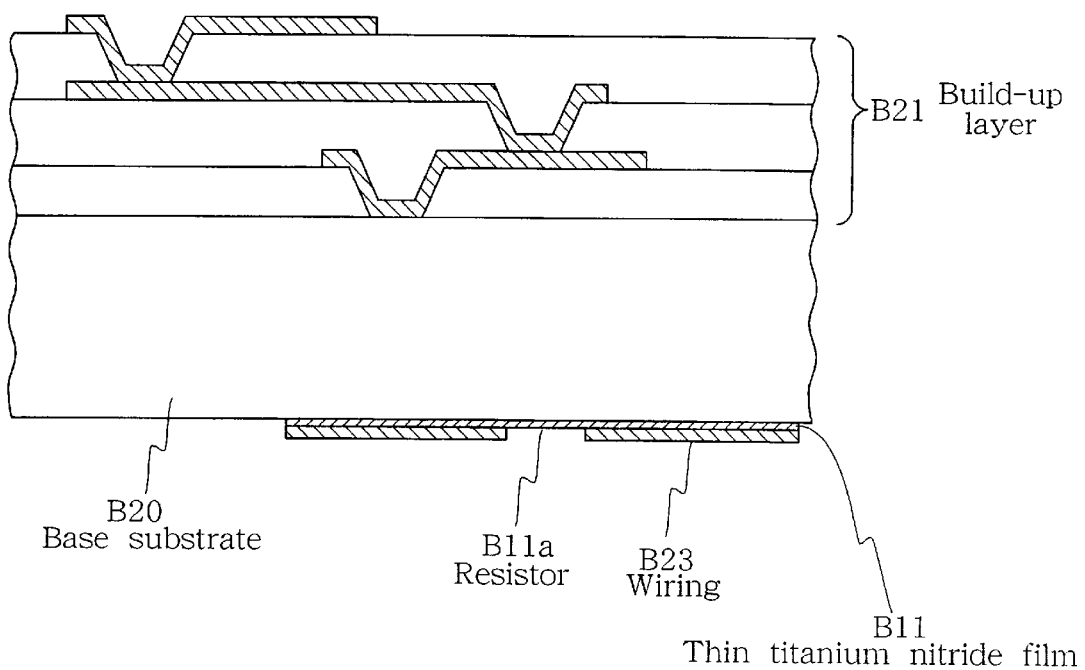
FIG. 17 is a sectional view showing one embodiment of the wiring substrate according to this invention and showing the case in which the titanium nitride resistor is provided on the surface of the base substrate located on the rear surface of the build-up layer in the build-up circuit board.
Figure 18:
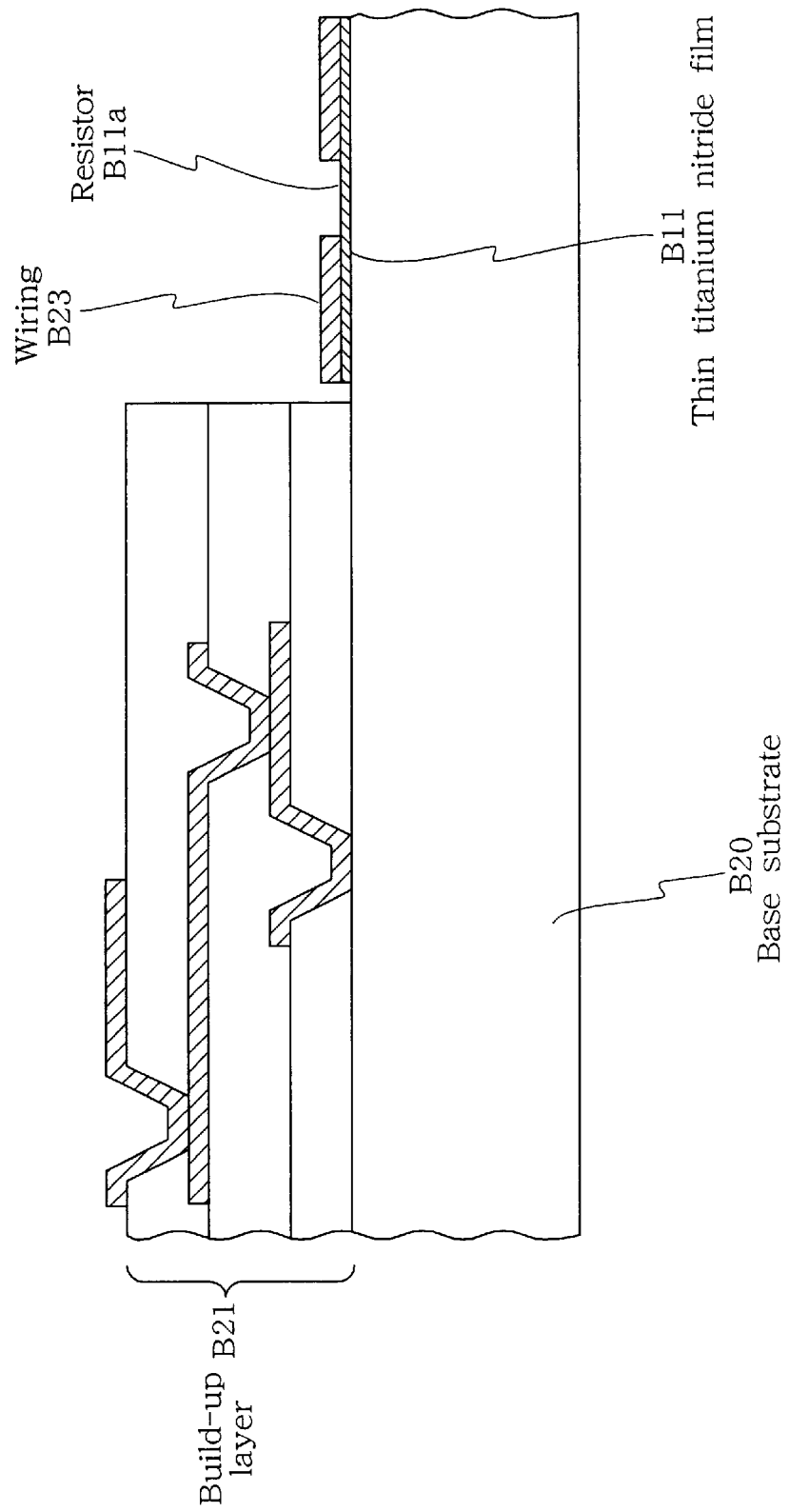
FIG. 18 is a sectional view showing one embodiment of the wiring substrate according to this invention and showing the case in which the titanium nitride resistor is provided on the surface of the base substrate in the build-up circuit board from which the build-up layer is absent.

In addition, FIG. 15 shows a mode in which the resistor is placed in the interface between the base substrate and the build-up layer, FIG. 16 shows a mode in which the resistor is placed on the surface of the build-up layer, FIG. 17 shows a mode in which the resistor is placed on the surface of the base substrate located on the rear surface of the build-up layer, and FIG. 18 shows a mode in which the resistor is placed on the surface of the base substrate with no build-up layer provided thereon.

As clearly shown in these figures, the place in which the resistor is formed is not limited. In addition, the resistor may be formed in a plurality of layers. Furthermore, the ground coat for the electrode or wiring in a layer with no resistor formed therein maybe the thin titanium nitride film or another thin film, or no ground coat may be provided. The use of titanium nitride for the ground coat for the wiring is effective in improving reliability because titanium nitride can maintain adhesion with the substrate and because it can prevent metal ions such as copper used for the wiring from diffusing to the substrate.

Next, a method for manufacturing a wiring substrate according to the embodiment shown in FIG. 13 will be described. First, a first embodiment of the manufacturing method will be described with reference to the flowchart in FIG. 19.

First, titanium nitride and copper are continuously sputtered on the insulated substrate B10 in this order to form a titanium nitride sputtered film B11 and a copper sputtered film. The method for sputtering titanium nitride during this step is preferably reactive DC sputtering that uses a titanium target and that introduces a nitrogen gas or a mixed gas of nitrogen and argon. The method, however, may be RF sputtering or other method and is not limited.

Next, a photoresist film is formed by means of spin coating and then patterned, and the pattern of electrodes and wiring is removed from the photoresist film. At this point, if a thin-film-resistor built-in substrate is to be obtained, electrodes are formed at positions at which a resistor is placed and disconnected portions are formed in the wiring.

Next, for example, a copper film is formed by means of electroplating using thin copper films as electrodes.

Next, the photoresist film is stripped by the ash method to leave the copper film in a pattern of electrodes and wiring using the semi-additive method.

Subsequently, the copper sputtered film is etched and removed using, for example, a mixed water solution of sulfuric acid and hydrogen peroxide.

Next, the photoresist film is formed and patterned into a resistor.

Then, the titanium nitride sputtered film B11 is etched using a mixed water solution of ammonia and hydrogen peroxide. In this case, the photoresist film, the wiring, and the electrodes function as an etching mask.

Finally, the photoresist film is stripped by the ash method to manufacture a wiring substrate such as that shown in FIG. 13.

In addition, a second embodiment of a method for manufacturing a wiring substrate according to the embodiment shown in FIG. 13 will be described with reference to the flowchart in FIG. 20.

First, a thin titanium nitride film is formed by the sputtering method to form a titanium nitride sputtered film.

Next, a photoresist film is formed by spin coating and then patterned to form a pattern of electrodes and wiring opened in the photoresist form.

Next, for example, a copper film is formed by the electroless plating method.

Next, the photoresist film is stripped by the ash method to leave the copper film into a pattern of electrodes and wiring using the lift method.

Next, the photoresist film is formed and patterned into a resistor.

Then, the titanium nitride sputtered film is etched using a mixed water solution of ammonia and hydrogen peroxide.

Finally, the photoresist film is stripped by the ash method to manufacture a wiring substrate such as that shown in FIG. 13.

Although the above manufacturing methods form the photoresist film prior to the formation of the conductor film and thus the wiring, the photoresist film may be formed after the formation of the conductor film and prior to the etching of the conductor film executed to form the wiring.

According to these methods for manufacturing a wiring substrate, the first embodiment requires only a single sputtering step due to the formation of both the thin titanium nitride film and the thin copper film by means of continuous sputtering, and the second embodiment also requires only a single sputtering step.

Figure 24:
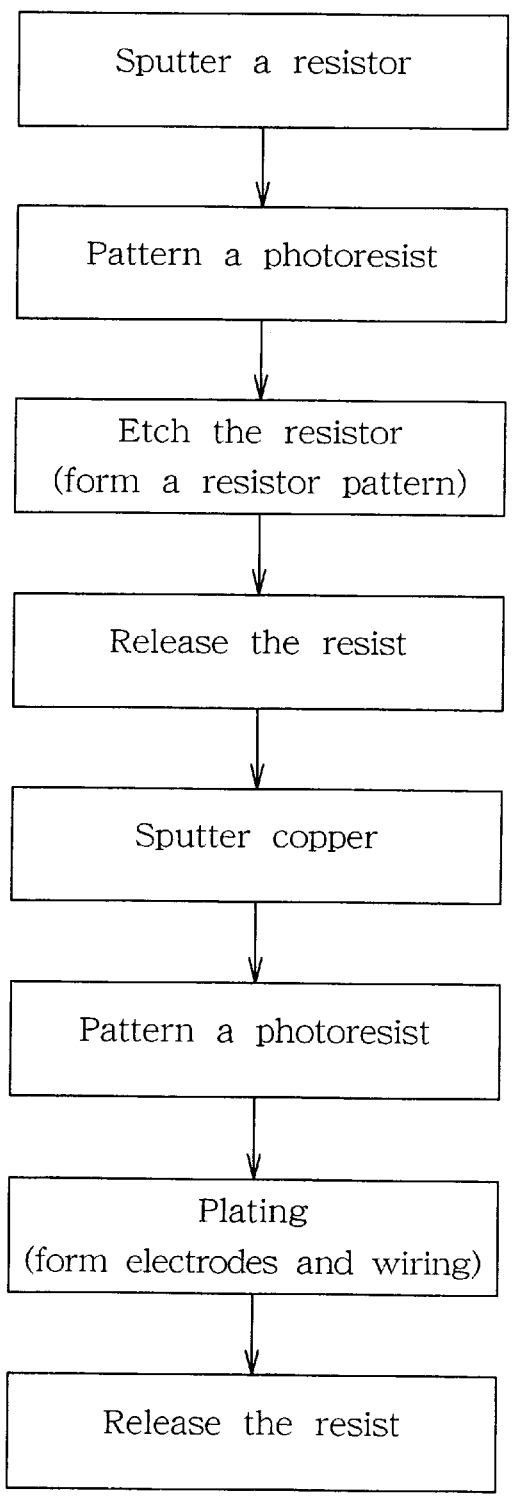
FIG. 24 is a flowchart describing a conventional method for manufacturing a resistor built-in wiring substrate.

FIG. 24 shows a flowchart of an example of a process for manufacturing a conventional substrate with a resistor built therein.

In this manufacturing process, a film of resistor is formed by sputtering, a photoresist film is then formed and patterned, and a resistor is produced by means of etching. Subsequently, the photoresist is stripped, a copper sputtered film is then formed, and a photoresist film is formed and patterned. A copper film is formed by the plating method, and the photoresist film is then stripped to form electrodes and wiring composed of copper.

If the sputtering step is used for both the resistor and the wiring, such a conventional method for manufacturing a wiring substrate requires two sputtering steps. Even if the wiring is formed prior to the formation of the resistor, two sputtering steps are also required.

Figure 19:
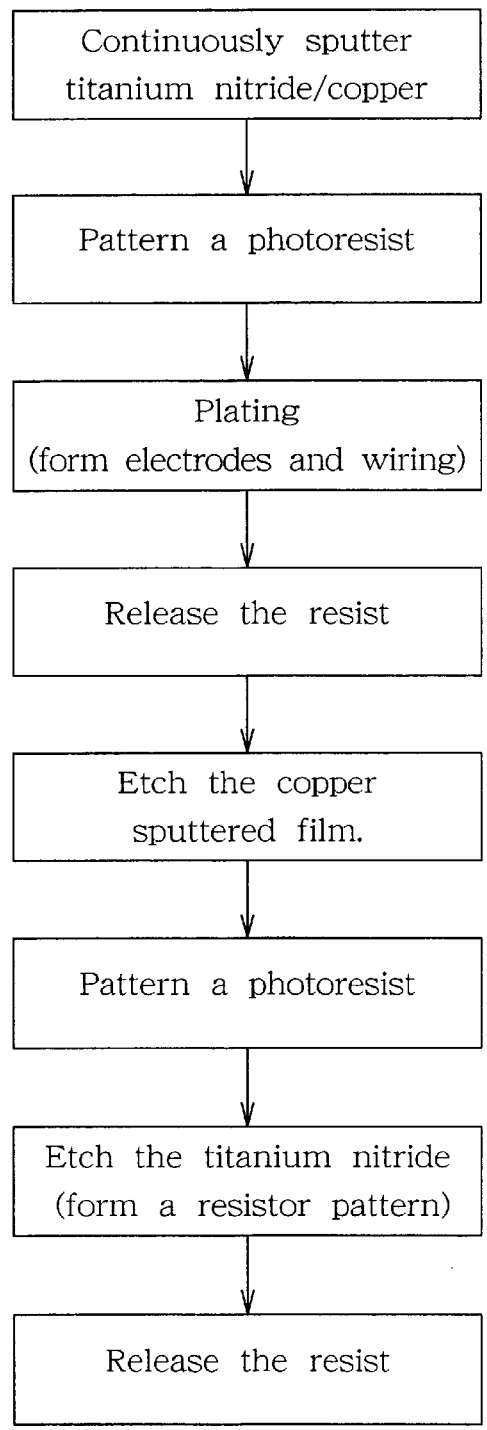
FIG. 19 is a flowchart describing a method for manufacturing a resistor built-in wiring substrate according to the wiring substrate of this invention, according to a second embodiment.
Figure 20:
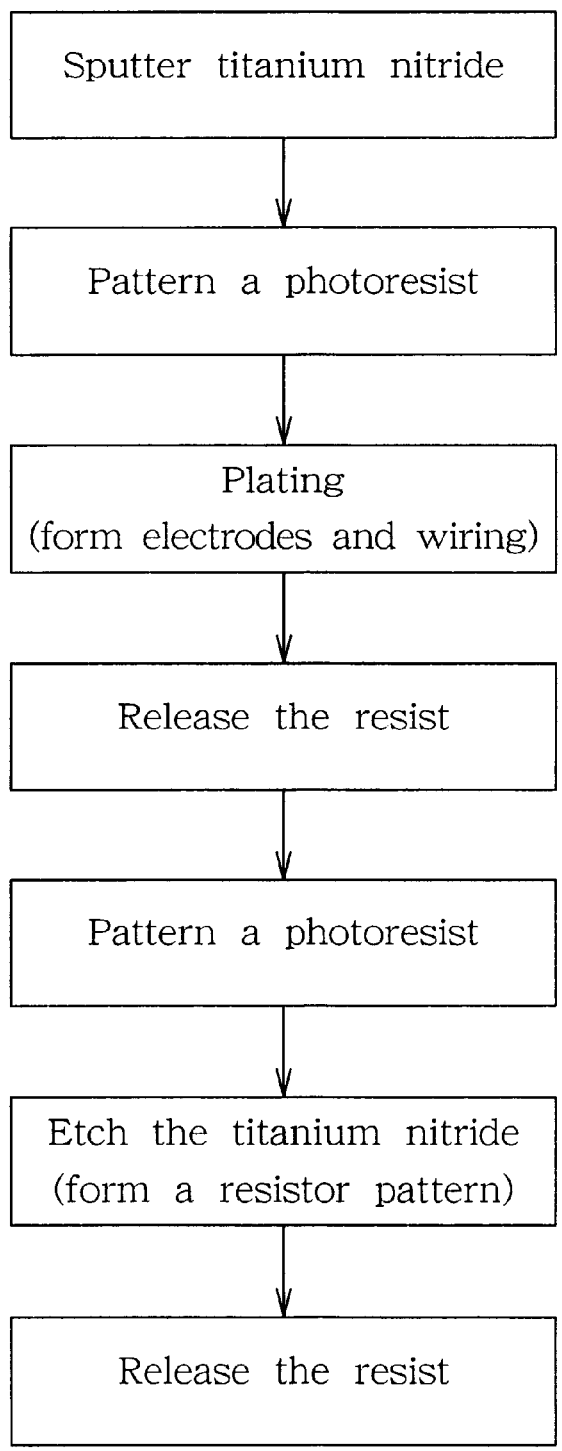
FIG. 20 is a flowchart describing a method for manufacturing a resistor built-in wiring substrate according to the wiring substrate of this invention, according to a third embodiment.

The present process for manufacturing a wiring substrate, which is shown in FIGS. 19 and 20, requires only a single sputtering step. Thus, the present method for manufacturing a wiring substrate evidently has a shorter process than the conventional method. This process is possible because titanium nitride is insoluble in an acid such as a sulfuric acid used as an etchant for the wiring metal such as copper whereas it is soluble in a solution containing ammonia and hydrogen peroxide, thereby preventing the etching liquid from attacking the wiring metal such as copper, the electrode metal such as Ni or Au used for the topmost layer, and the substrate.

In addition, in order to prevent the resistance value from varying over time due to the diffusion between the resistor and the electrodes or wiring, Japanese Patent Application Laid-Open No. 4-174590 and Japanese Patent Application Laid-Open No. 7-34510 disclose a structure having a diffusion prevention film in the interface between the resistor and the electrode or wiring and a structure in which the surface of a nickel chrome (nichrome) alloy layer that is a resistor is passivated, respectively. Due to the excellent barrier capability of titanium nitride, however, this invention eliminates the needs for such passivation processing to reduce the number of required steps, thereby contributing to improving productivity.

Next, another embodiment of this invention will be described in detail with reference to the drawings.

Figure 21:
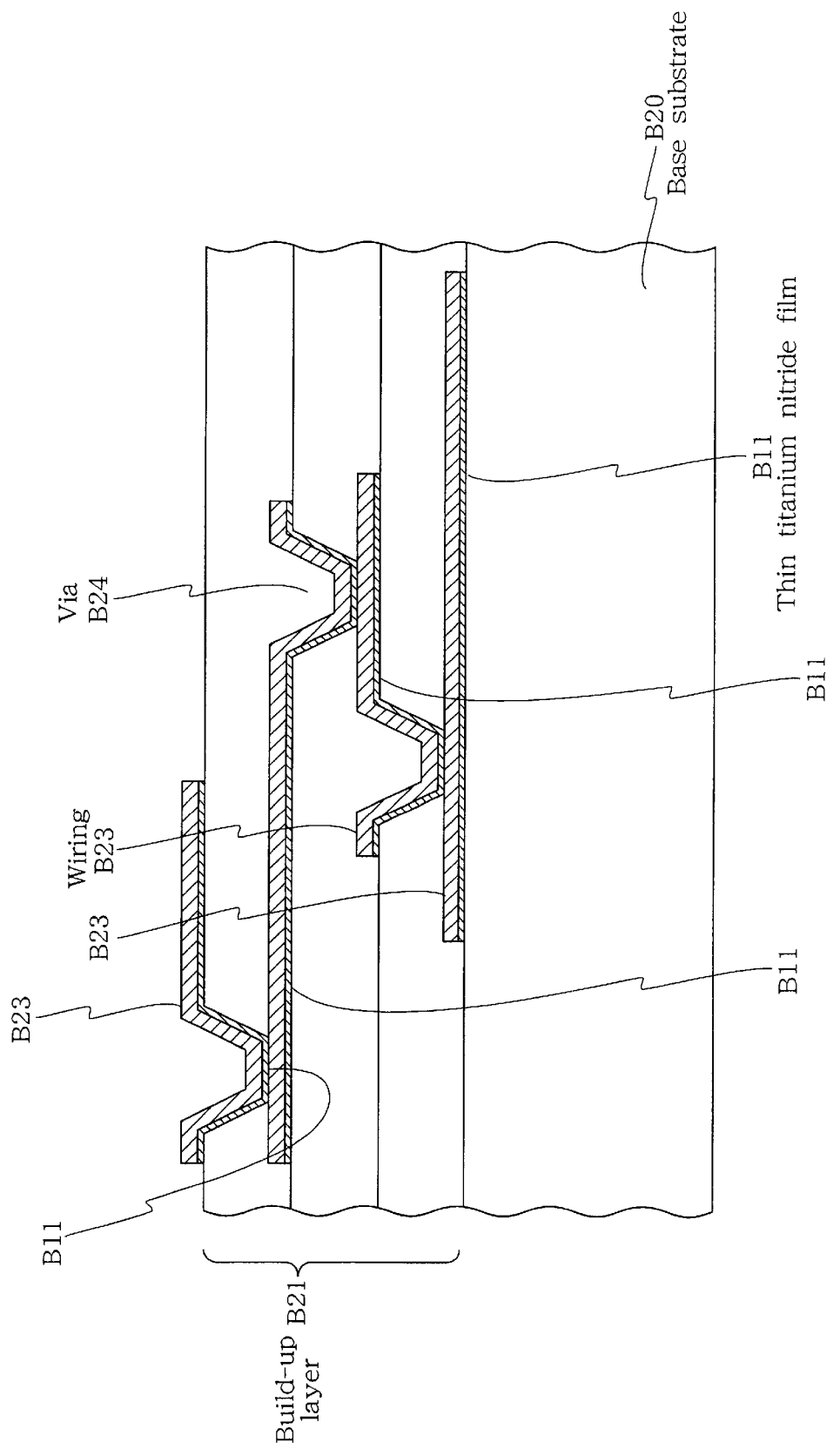
FIG. 21 is a sectional view showing another embodiment of the wiring substrate of this invention and showing the structure of a wiring substrate.

FIG. 21 shows the structure of a wiring substrate according to another embodiment of this invention. This figure shows an example of an application to a build-up circuit board. This wiring substrate is characterized in that a ground coat for a wiring provided on an insulator such as the base substrate B20 or build-up layer B21 and comprising metal or alloy comprising a thin titanium nitride film and in that the wiring B23 forms a laminated structure with the thin titanium nitride film B11.

As in the resistor build-in circuit board, the insulated substrate comprises a build-up circuit board, a printed circuit board, an Si substrate with an insulating layer, a ceramic substrate, an organic film, a glass plate, or a metal plate or foil with an insulating layer, and may have an internal wiring, vias, or through-holes.

In addition, titanium nitride preferably comprises a thin film formed by PVD or CVD but is not limited. Its shape or composition is neither limited.

The metal or alloy used for the wiring can be preferably formed by means of plating but its type or composition is not limited. In addition, the metal or alloy used for the wiring may be a plurality of metal or alloy layers. In particular, if such metal or alloy is used for the electrodes in the topmost layer, a barrier metal or an oxidation preventing or a wettability improving metal is effectively provided on the metal used for the wiring.

According to the structure of the wiring substrate shown in FIG. 21, the ground coat for the wiring may be titanium nitride to enable easy wet etching in order to provide a wiring with an excellent adhesion.

The wet etching method for titanium nitride is not limited, but the etchant is preferably a water solution of ammonia and hydrogen peroxide. Such an etchant can prevent the substrate from being degraded. A substrate using Ti as the ground coat allows the use of a similar etchant, but the present titanium nitride is characterized in that by varying the film formation conditions, the composition of the film or the morphology of the crystal film can be varied to adjust the stress of the thin film correspondingly. The adjustments of the stress can provide good adhesion for any substrate.

The stress can be easily adjusted particularly by using reactive sputtering that uses a titanium target and that introduces a nitrogen gas or a mixed gas of nitrogen and argon and controlling the pressure during sputtering and the temperature of the substrate. In addition, due to its high barrier capability, titanium nitride is characterized to preclude the diffusion of the metal or alloy to the substrate used for the wiring according to the present structure, resulting in a high reliability.

EXAMPLES

Next, examples of this invention will be described.

The results of production of resistance-measuring testing elements groups (TEGs) having the structure of the wiring substrate with the titanium nitride resistor built therein according to this invention shown in FIG. 13 will be explained.

Sets of wires and sets of two resistors having the respective pattern sizes resistor width WR and resistor length LR shown in Table 1 at Nos. 1 to 27 were produced in a single insulated substrate to produce the substrate with the 54 resistors. Referencing FIG. 13, an electrode width WE and electrode length LE corresponding to the connection with the resistor were set at 2 mm and 100 $\mu$m, respectively, and in patterns Nos. B1 to B3, the resistor was not formed and the substrates were used to measure contact and wiring resistance.

TABLE 1

| Pattern No. | Wiring width ($\mu$m) | Resistor width ($\mu$m) | Resistor length ($\mu$m) |
|---|---|---|---|
| No. B1 | 25 | — | — |
| No. B2 | 50 | — | — |
| No. B3 | 100 | — | — |
| No. 1 | 25 | 0.1 | 0.1 |
| No. 2 | 25 | 0.2 | 0.2 |
| No. 3 | 25 | 0.1 | 0.2 |
| No. 4 | 25 | 0.2 | 0.2 |
| No. 5 | 25 | 0.4 | 0.2 |
| No. 6 | 25 | 0.2 | 0.4 |
| No. 7 | 25 | 0.4 | 0.4 |
| No. 8 | 25 | 0.8 | 0.8 |
| No. 9 | 25 | 1.6 | 1.6 |
| No. 10 | 50 | 0.1 | 0.1 |
| No. 11 | 50 | 0.2 | 0.1 |
| No. 12 | 50 | 0.1 | 0.2 |
| No. 13 | 50 | 0.2 | 0.2 |
| No. 14 | 50 | 0.4 | 0.2 |
| No. 15 | 50 | 0.2 | 0.4 |
| No. 16 | 50 | 0.4 | 0.4 |
| No. 17 | 50 | 0.8 | 0.8 |
| No. 18 | 50 | 1.6 | 1.6 |
| No. 19 | 100 | 0.1 | 0.1 |
| No. 20 | 100 | 0.2 | 0.1 |
| No. 21 | 100 | 0.1 | 0.2 |
| No. 22 | 100 | 0.2 | 0.2 |
| No. 23 | 100 | 0.4 | 0.2 |
| No. 24 | 100 | 0.2 | 0.4 |
| No. 25 | 100 | 0.4 | 0.4 |
| No. 26 | 100 | 0.8 | 0.8 |
| No. 27 | 100 | 1.6 | 1.6 |

The sputter-up type inline DC sputter apparatus was used to continuously form thin films of titanium nitride and copper in this order, on a 100-mm$^2$ printed circuit board FR-4 coated with an epoxy acrylate having a fluorene skeleton and described in Japanese Patent Application Laid-Open No. 9-214141 and on an Si wafer of 5 inch diameter with an oxide film formed on its surface.

The pressure in the chamber of the sputter apparatus was evacuated down to 9.9×10$^{-7}$ Torr or less and was then maintained between 0.5 and 10 mTorr during the formation of a thin titanium nitride film by introducing 50 sccm of nitrogen into the chamber while controlling an evacuation orifice. The temperature of the substrate was set between 25 and 200° C., the speed at which the substrate moved over a target was set between 100 and 500 mm/min., and the sputter current was set between 2.5 and 8 A.

During the formation of a copper film, the pressure was maintained at 3 mTorr by introducing 50 sccm of argon while controlling the evacuation orifice. The temperature of the substrate was set at 60° C., the speed at which the substrate moved over the target was set at 300 mm/min., and the sputter current was set at 4 A.

Next, photoresist coating, patterning, and copper electroplating were executed on these substrates to form electrodes and wires, and the resist was then stripped. The copper sputtered film was etched using a mixed water solution of sulfuric acid, hydrogen peroxide, and water.

Next, a photoresist was coated and patterned, and the titanium nitride film was etched using a mixed water solution of ammonia and hydrogen peroxide. Then, the resist was stripped to obtain a pattern of titanium nitride resistor.

Finally, only measuring pads were opened and the epoxy acrylate having the fluorene skeleton was coated to produce resistance-measuring TEGs.

Table 2 shows the types of the produced TEG substrates, the titanium nitride film formation conditions, the mean value of the sheet resistivity converted from the measured resistance values from the 54 positions, and the tolerance of the sheet resistivity.

FR-4 circuit board can be controlled to between 25 Ω/square and 3.2 kΩ/square while the sheet resistivity of the Si substrate can be controlled to between 15 Ω/square and 2.0 kΩ/square. Under the same titanium nitride film formation conditions, the FR-4 circuit board has a larger sheet resistivity value and tolerance than the Si substrate. This is assumed to be due to the difference in surface flatness.

In addition, FR-4 circuit board Nos. 2 and 3 had extremely high sheet resistivity tolerances because cracks or wrinkles occurred in the produced resistor pattern. However, circuit boards Nos. 10 and 24, which exhibited high resistance values of a kΩ order, had large sheet resistivity tolerances despite the absence of cracks or wrinkles.

On the other hand, the FR-4 circuit boards of substrate Nos. 13 and 14 had very small sheet resistivity tolerances within ±5%, and the Si substrates with substrate Nos. 27 and 28 had very small sheet resistivity tolerances dispersing ±2%.

Thus, assuming that heating at 150° C. or more is effective in reducing the tolerance in resistance values, the titanium nitride film was formed by varying the sputter chamber pressure under each set of conditions including the target substrate temperature of 150° C. shown in Table 3 below. As in Table 2, Table 3 shows the types of the substrates, the

TABLE 2

| Substrate No. | Substrate | Current (A) | Substrate speed (mm/min) | $N_2$ pressure (mTorr) | Substrate temperature (° C.) | Sheet resistivity (Ω/square) | Sheet resistivity tolerance (%) |
|---|---|---|---|---|---|---|---|
| 1 | FR-4 | 4 | 100 | 3 | 25 | 75 | ±7 |
| 2 | FR-4 | 4 | 200 | 3 | 25 | 186 | ±10 |
| 3 | FR-4 | 4 | 300 | 3 | 25 | 325 | ±20 |
| 4 | FR-4 | 4 | 400 | 3 | 25 | 480 | ±6 |
| 5 | FR-4 | 8 | 100 | 3 | 25 | 25 | ±6 |
| 6 | FR-4 | 8 | 200 | 3 | 25 | 50 | ±3 |
| 7 | FR-4 | 8 | 300 | 3 | 25 | 81 | ±3 |
| 8 | FR-4 | 8 | 400 | 3 | 25 | 143 | ±5 |
| 9 | FR-4 | 8 | 500 | 3 | 25 | 206 | ±8 |
| 10 | FR-4 | 4 | 100 | 10 | 25 | 3204 | ±20 |
| 11 | FR-4 | 2.5 | 100 | 0.5 | 25 | 44 | ±5 |
| 12 | FR-4 | 4 | 100 | 3 | 100 | 65 | ±8 |
| 13 | FR-4 | 4 | 100 | 3 | 150 | 60 | ±5 |
| 14 | FR-4 | 4 | 100 | 3 | 200 | 82 | ±5 |
| 15 | Si | 4 | 100 | 3 | 25 | 54 | ±6 |
| 16 | Si | 4 | 200 | 3 | 25 | 126 | ±4 |
| 17 | Si | 4 | 300 | 3 | 25 | 209 | ±2 |
| 18 | Si | 4 | 400 | 3 | 25 | 252 | ±2 |
| 19 | Si | 8 | 100 | 3 | 25 | 15 | ±10 |
| 20 | Si | 8 | 200 | 3 | 25 | 38 | ±6 |
| 21 | Si | 8 | 300 | 3 | 25 | 60 | ±3 |
| 22 | Si | 8 | 400 | 3 | 25 | 95 | ±3 |
| 23 | Si | 8 | 500 | 3 | 25 | 124 | ±4 |
| 24 | Si | 4 | 100 | 10 | 25 | 2017 | ±10 |
| 25 | Si | 2.5 | 100 | 0.5 | 25 | 36 | ±8 |
| 26 | Si | 4 | 100 | 3 | 100 | 46 | ±3 |
| 27 | Si | 4 | 100 | 3 | 150 | 42 | ±2 |
| 28 | Si | 4 | 100 | 3 | 200 | 56 | ±2 |

These results indicate that depending on the titanium nitride film formation conditions, the sheet resistivity of the titanium nitride film formation conditions, the mean value of the sheet resistivity, and the tolerance of the sheet resistivity.

TABLE 3

| Substrate No. | Substrate | Current (A) | Substrate speed (mm/min) | N$_2$ pressure (mTorr) | Substrate temperature (° C.) | Sheet resistivity (Ω/square) | Sheet resistivity tolerance (%) |
|---|---|---|---|---|---|---|---|
| 29 | FR-4 | 2.5 | 100 | 0.5 | 150 | 32 | ±5 |
| 30 | FR-4 | 2.5 | 500 | 0.5 | 152 | 383 | ±10 |
| 31 | FR-4 | 4 | 100 | 1 | 152 | 30 | ±7 |
| 32 | FR-4 | 4 | 500 | 1 | 153 | 298 | ±9 |
| 33 | FR-4 | 4 | 100 | 3 | 152 | 58 | ±5 |
| 34 | FR-4 | 4 | 500 | 3 | 151 | 636 | ±3 |
| 35 | FR-4 | 8 | 100 | 3 | 151 | 34 | ±4 |
| 36 | FR-4 | 8 | 500 | 3 | 153 | 138 | ±3 |
| 37 | FR-4 | 4 | 100 | 6 | 147 | 424 | ±9 |
| 38 | FR-4 | 4 | 500 | 6 | 150 | 1652 | ±11 |
| 39 | FR-4 | 8 | 100 | 6 | 153 | 71 | ±8 |
| 40 | FR-4 | 8 | 500 | 6 | 151 | 311 | ±6 |
| 41 | FR-4 | 4 | 100 | 10 | 150 | 2115 | ±15 |
| 42 | FR-4 | 4 | 500 | 10 | 153 | 2753 | ±8 |
| 43 | FR-4 | 8 | 100 | 10 | 152 | 224 | ±5 |
| 44 | FR-4 | 8 | 500 | 10 | 153 | 535 | ±8 |
| 45 | Si | 2.5 | 100 | 0.5 | 150 | 25 | ±5 |
| 46 | Si | 2.5 | 500 | 0.5 | 152 | 180 | ±5 |
| 47 | Si | 4 | 100 | 1 | 152 | 25 | ±4 |
| 48 | Si | 4 | 500 | 1 | 153 | 161 | ±3 |
| 49 | Si | 4 | 100 | 3 | 152 | 42 | ±2 |
| 50 | Si | 4 | 500 | 3 | 151 | 300 | ±2 |
| 51 | Si | 8 | 100 | 3 | 151 | 15 | ±5 |
| 52 | Si | 8 | 500 | 3 | 153 | 87 | ±1 |
| 53 | Si | 4 | 100 | 6 | 147 | 439 | ±4 |
| 54 | Si | 4 | 500 | 6 | 150 | 849 | ±2 |
| 55 | Si | 8 | 100 | 6 | 153 | 56 | ±8 |
| 56 | Si | 8 | 500 | 6 | 151 | 198 | ±3 |
| 57 | Si | 4 | 100 | 10 | 150 | 1561 | ±3 |
| 58 | Si | 4 | 500 | 10 | 153 | 2171 | ±3 |
| 59 | Si | 8 | 100 | 10 | 152 | 201 | ±5 |
| 60 | Si | 8 | 500 | 10 | 153 | 464 | ±5 |

As clearly shown in Table 3, heating the substrate slightly changed the mean value of the sheet resistivity compared to the absence of heating, and this value could be controlled to between 30 Ω/square and 2.8 kΩ/square for the FR-4 circuit board and to between 15 Ω/square and 2.2 kΩ/square for the Si substrate. The tolerance of sheet resistivity was reduced compared to each set of conditions without heating. Although a few cracks were observed in the titanium nitride resistor in substrate No. 39, no cracks or wrinkles were found in the other titanium nitride resistors and they exhibited a uniform external appearance.

The FR-4 circuit boards of substrate Nos. 29, 33, 34, 35, 36, and 43 had sheet resistivity tolerances within ±5%, and within this range of tolerance, their sheet resistivity could be controlled to between 32 Ω/square and 636 Ω/square. The Si substrates of substrate Nos. 45 to 60 except No. 55 had sheet resistivity tolerances within ±5%, and within this range of tolerance, their sheet resistivity could be controlled to between 15 Ω/square and 2.2 kΩ/square. Heating the substrate during film formation enabled both the FR-4 circuit boards and the Si substrates to be controlled to a wider range of sheet resistivity values than the absence of heating.

The structure of this invention is assumed to provide the above accurate resistance because the use of the titanium nitride resistor enables the use of an etchant that is unlikely to damage the substrate, because the single use of a thin-film formation apparatus such as a sputter reduces the degradation such as oxidation of the surface of titanium nitride, and because the continuous sputtering of titanium nitride/copper provides an excellent adhesion between the titanium nitride resistor and the wiring metal.

According to the wiring substrate of this invention, the wiring is laminated on the thin titanium nitride film so that the thin titanium nitride film excellent in adhesion and barrier capability functions as an effective ground coat layer, thereby reducing the number of required manufacturing steps and providing a reliable wiring substrate.

In addition, according to the wiring substrate of this invention, the thin titanium nitride film is used as the ground coat layer for both the resistor and the wiring, thereby providing a thin-film-resistor built-in wiring substrate of a fine wiring structure that can provide an accurate resistance value, that includes a reliable wiring layer, and that can reduce the number of required manufacturing steps.

In addition, the present method for manufacturing a wiring substrate enables a reliable wiring substrate to be manufactured using a small number of steps.

Furthermore, according to the present method for manufacturing a wiring substrate, a small number of steps can be used to provide a thin-film-resistor built-in wiring substrate of a fine wiring structure that has an accurate resistance value and a reliable wiring layer. The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 10-165112 (Filed on Jun. 12, 1998) and Japanese Patent Application No. 10-170313 (Filed on Jun. 17, 1998) including specification, claims, drawings and summary are incorporated herein by reference in its entirety.

What is claimed is:

1. A thin-film resistor comprising a very thin film of a resistive material deposited over an insulating substrate, said thin film resistor being adapted for use with a supporting substrate having wiring in the form of a pattern of conductive material thereon, said supporting substrate being selected from a group consisting of an Si substrate with insulating layer, a printed circuit board, a built-up circuit board, a ceramic substrate, an organic film, a glass plate, a metal plate or foil with an insulating layer; said resistive material being an amorphous titanium nitride based composite deposited in a thin layer on said insulative substrate, said composite having at least one form of titanium selected from a group consisting of crystal titanium nitride or crystal titanium in said amorphous titanium nitride matrix, and said resistive material having a low conductivity as compared to the conductivity of said conductive material forming said wiring.

2. The thin-film resistor according to claim 1, wherein the number of nitrogen atoms in said composite is $\frac{1}{3}$ to $\frac{2}{3}$ of the total number of atoms.

3. The thin-film resistor according to claim 1, wherein said crystal titanium nitride is at least one of TiN and $Ti_2N$.

4. The thin-film resistor according to claim 2, wherein said crystal titanium nitride is at least one of TiN and $Ti_2N$.

5. The thin-film resistor according to claim 1, wherein the specific resistivity of said printed circuit board is 0.1 mΩ cm to 100 mΩ cm.

6. A wiring substrate having a thin-film resistor according to claim 1 built in an inner layer of said insulating substrate.

7. A wiring substrate having a thin-film resistor according to claim 1 said resistor being located built on a surface of said insulator substrate.

8. The thin-film resistor of claim 1, wherein the thin film resistor has added nitrogen atoms derived from a gas containing nitrogen and the titanium is derived from DC magnetron sputtering.

9. A wiring substrate having a pattern of conductive material forming at least wiring supporting substrate, and a thin film titanium nitride resistor formed on an insulator substrate, and said thin titanium nitride film being adapted to be connected to said wiring, said thin film having an electrical resistance which is greater than the resistance of said conductive material forming said wiring.

10. The wiring substrate according to claim 9, wherein said wiring is configured by means of copper electroplating.

11. The wiring substrate according to claim 9, wherein the wiring substrate has a plurality of layers of insulators, the wiring being placed on one of said plurality of layers of insulators.

12. The wiring substrate according to claim 9 wherein the wiring substrate has a plurality of insulators thereon and said wiring is placed over said plurality of insulators.

13. The wiring substrate of claim 9 wherein said thin titanium nitride film is on the surface of said insulator substrate, and said thin titanium nitride film is patterned, said wiring being over said patterned thin titanium nitride film.

14. The wiring substrate of claim 9 wherein said thin titanium nitride film is on the surface of said insulator substrate and said wiring over said thin titanium nitride film has a discontinuous portion, and said titanium film that is located under the discontinuous portion of said wiring is patterned to form said resistor.

15. The wiring substrate of claim 9 further comprising a thin copper film on said thin titanium nitride film and a copper wiring formed in the thin copper film.

16. The wiring substrate of claim 15 wherein said thin copper film is a electroplating film.

17. A wiring substrate comprising an insulator, a pattern of wiring conductors formed on said insulator, and a thin film resistor formed in said wiring pattern, said thin film resistor comprising a thin titanium nitride film having a low conductivity as compared to the conductivity of said wiring, the thin titanium nitride film being interposed between said wiring and said insulator.

18. The wiring substrate according to claim 17, wherein said wiring is configured by means of copper electroplating.

* * * * *